United States Patent
Enatsu et al.

(10) Patent No.: US 11,588,096 B2
(45) Date of Patent: Feb. 21, 2023

(54) METHOD TO ACHIEVE ACTIVE P-TYPE LAYER/LAYERS IN III-NITRTDE EPITAXIAL OR DEVICE STRUCTURES HAVING BURIED P-TYPE LAYERS

(71) Applicant: The Regents of the University of California, Oakland, CA (US)

(72) Inventors: Yuuki Enatsu, Goleta, CA (US); Chirag Gupta, Santa Barbara, CA (US); Stacia Keller, Santa Barbara, CA (US); Umesh K. Mishra, Montecito, CA (US); Anchal Agarwal, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 1049 days.

(21) Appl. No.: 16/092,165

(22) PCT Filed: Apr. 11, 2017

(86) PCT No.: PCT/US2017/027025
§ 371 (c)(1),
(2) Date: Oct. 8, 2018

(87) PCT Pub. No.: WO2017/180633
PCT Pub. Date: Oct. 19, 2017

(65) Prior Publication Data
US 2019/0181329 A1 Jun. 13, 2019

Related U.S. Application Data

(60) Provisional application No. 62/415,807, filed on Nov. 1, 2016, provisional application No. 62/321,194, filed on Apr. 11, 2016.

(51) Int. Cl.
*H01L 41/18* (2006.01)
*H01L 33/08* (2010.01)
(Continued)

(52) U.S. Cl.
CPC .............. *H01L 41/18* (2013.01); *H01L 21/00* (2013.01); *H01L 21/02002* (2013.01);
(Continued)

(58) Field of Classification Search
CPC ....................................... H01L 41/18
See application file for complete search history.

(56) References Cited

U.S. PATENT DOCUMENTS

| 2008/0081390 A1 | 4/2008 | Gaska et al. |
| 2009/0072254 A1 | 3/2009 | Chakraborty |

(Continued)

FOREIGN PATENT DOCUMENTS

| WO | 03/041230 | 5/2003 |

OTHER PUBLICATIONS

PCT International Search Report and Written Opinion dated Jul. 13, 2017 for PCT Application No. PCT/US2017/27025.
(Continued)

*Primary Examiner* — Douglas M Menz
(74) *Attorney, Agent, or Firm* — Gates & Cooper LLP

(57) ABSTRACT

An optoelectronic or electronic device structure, including an active region on or above a polar substrate, wherein the active region comprises a polar p region. The device structure further includes a hole supply region on or above the active region. Holes in the hole supply region are driven by a field into the active region, the field arising at least in part due to a piezoelectric and/or spontaneous polarization field generated by a composition and grading of the active region.

21 Claims, 31 Drawing Sheets

(51) Int. Cl.
H01L 29/36 (2006.01)
H01L 29/861 (2006.01)
H01L 29/20 (2006.01)
H01L 29/205 (2006.01)
H01L 21/00 (2006.01)
H01L 41/107 (2006.01)
H01L 21/02 (2006.01)

(52) U.S. Cl.
CPC ........ H01L 29/2003 (2013.01); H01L 29/205 (2013.01); H01L 29/36 (2013.01); H01L 29/861 (2013.01); H01L 33/08 (2013.01); H01L 41/107 (2013.01)

(56) References Cited

U.S. PATENT DOCUMENTS

2010/0327322 A1* 12/2010 Kub .................. H01L 29/0891
257/E21.403
2013/0026489 A1 1/2013 Gambin et al.
2015/0221760 A1 8/2015 Kub et al.

OTHER PUBLICATIONS

Cho et al.,"Formation mechanism of V defects in the InGaN/GaN multiple quantum wells grown on GaN layers with low threading dislocation density". Appl. Phys. Lett. 79, 215 (2001).

Chowdhury et al., "CAVET on bulk GaN substrates achieved with MBE-regrown AlGaN/GaN layers to suppress dispersion," IEEE Electron Device Lett., vol. 33, No. 1, pp. 41-43, Jan. 2012.

Chowdhury et al., "Enhancement and depletion mode AlGaN/GaN CAVET with Mg-ion-implanted GaN as current blocking layer," IEEE Electron Device Lett., vol. 29, No. 6, pp. 543-545, Jun. 2008.

Enatsu et al., "Polarization induced three-dimensional hole gas in compositionally graded Inx Ga1-x N layer". Appl. Phys. Express 9, 075502 (2016).

Kanechika et al., "A vertical insulated gate AlGaN/GaN heterojunction field-effect transistor," Jpn. J. Appl. Phys., vol. 46, No. 21, pp. L503-L505, May 2007.

Keller et al., "Growth and characterization of N-polar InGaN/GaN multiquantum wells". Appl. Phys. Lett. 90, 191908 (2007).

Kodama et al., "GaN-based trench gate metal oxide semiconductor field-effect transistor fabricated with novel wet etching," Appl. Phys Exp., vol. 1, No. 2, pp. 021104-1-021104-3, Feb. 2008.

Kumakura et al.,"Mg-acceptor activation mechanism and transport characteristics in p-type InGaN grown by metalorganic vapor phase epitaxy". J. Appl. Phys. 93, 3370 (2003).

Laurent et al., "Technical Program". 53rd Annual Electronic Materials Conference, 2011, p. 54.

Nie et al., "1.5-kV and 2.2-mΩ.cm2 vertical GaN transistors on bulk-GaN substrates," IEEE Electron Device Lett., vol. 35, No. 9, pp. 939-941, Sep. 2014.

Oka et al., "1.8 mΩ.cm2 vertical GaN-based trench metal-oxide-semiconductor field-effect transistors on a free-standing GaN substrate for 1.2-kV-class operation," Appl. Phys. Exp., vol. 8, No. 5, pp. 054101-1-054101-3, May 2015.

Oka et al., "Vertical GaN-based trench metal oxide semiconductor field-effect transistors on a freestanding GaN substrate with blocking voltage of 1.6 kV," Appl. Phys. Exp., vol. 7, No. 2, pp. 021002-1-021002-3, Jan. 2014.

Otake et al., "GaN-based trench gate metal oxide semiconductor field effect transistors with over 100 cm2/(V-s) channel mobility," Jpn. J. Appl. Phys., vol. 46, No. 25, pp. L599-L601, Jun. 2007.

Otake et al., "Vertical GaN-based trench gate metal oxide semiconductor field-effect transistors on GaN bulk substrates," Appl. Phys. Exp., vol. 1, No. 1, pp. 011105-1-011105-3, Jan. 2008.

Qi et al., "High-voltage polarization-induced vertical heterostructure pn junction diodes on bulk GaN substrates". Device Research Conference 73rd Annual, 2015, p. 31.

Shiojiri et al., "Structure and formation mechanism of V defects in multiple InGaN/GaN quantum well layers". J. Appl. Phys. 99, 073505 (2006).

Simon et al. "Carrier transport and confinement in polarization-induced three-dimensional electron slabs: Importance of alloy scattering in AlGaN", Appl. Phys. Lett. 88, Apr. 21, 2009 (2006).

Simon et al., "Polarization-Induced Hole Doping in Wide-Band-Gap Uniaxial Semiconductor Heterostructures". Science 327, pp. 60-64 (2010).

Yasuda et al.,"Investigations of Polarization-Induced Hole Accumulations and Vertical Hole Conductions in GaN/AlGaN Heterostructures". Jpn. J. Appl. Phys. 52, 08JJ05-1 to 08JJ05-5 (2013).

Zhang et al., "Three-dimensional hole gas induced by polarization in (0001)-oriented metal-face III-nitride structure". Appl. Phys. Lett. 97, 062193-1 to 062193-3 (2010).

* cited by examiner

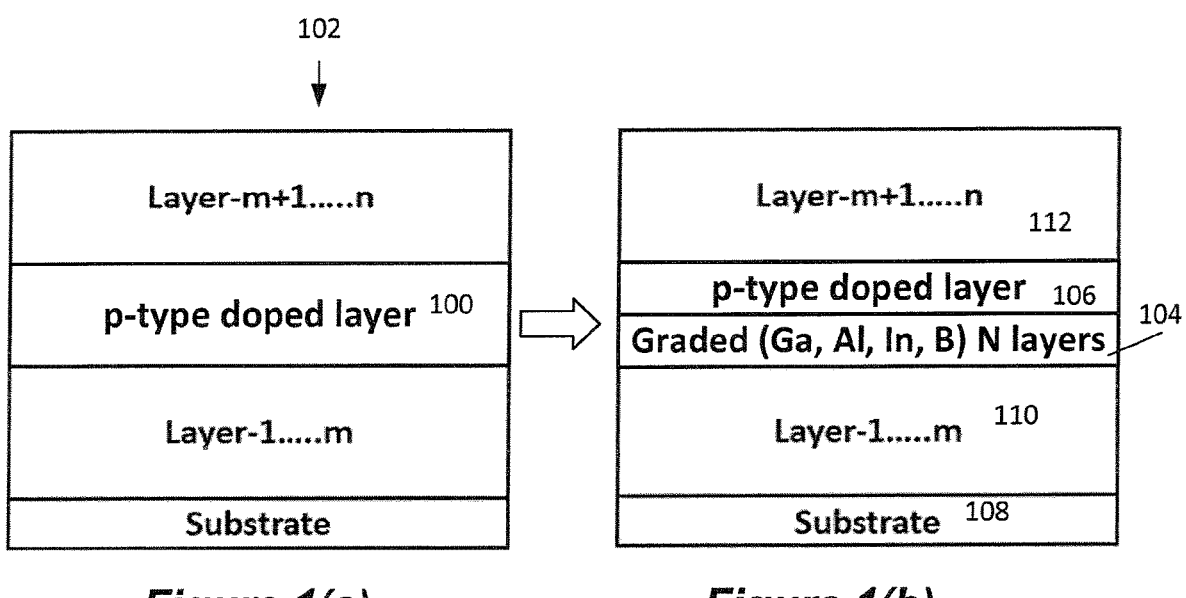
*Figure 1(a)*     *Figure 1(b)*

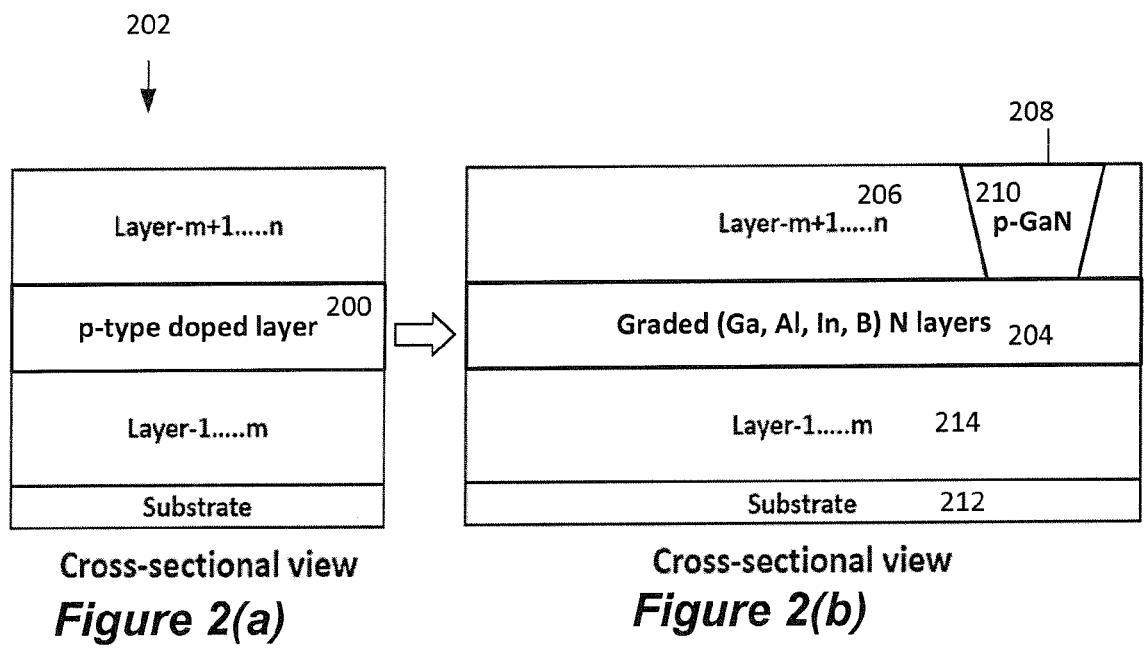
Figure 2(a) Cross-sectional view
Figure 2(b) Cross-sectional view
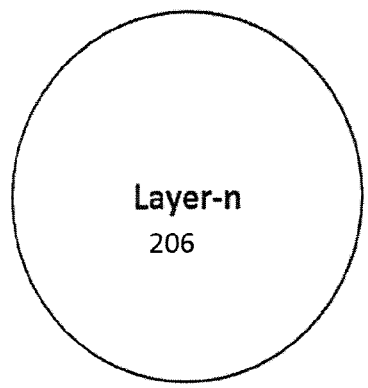
Top View
Figure 2(c)
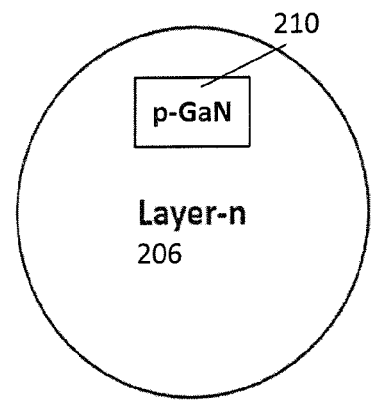
Top View
Figure 2(d)

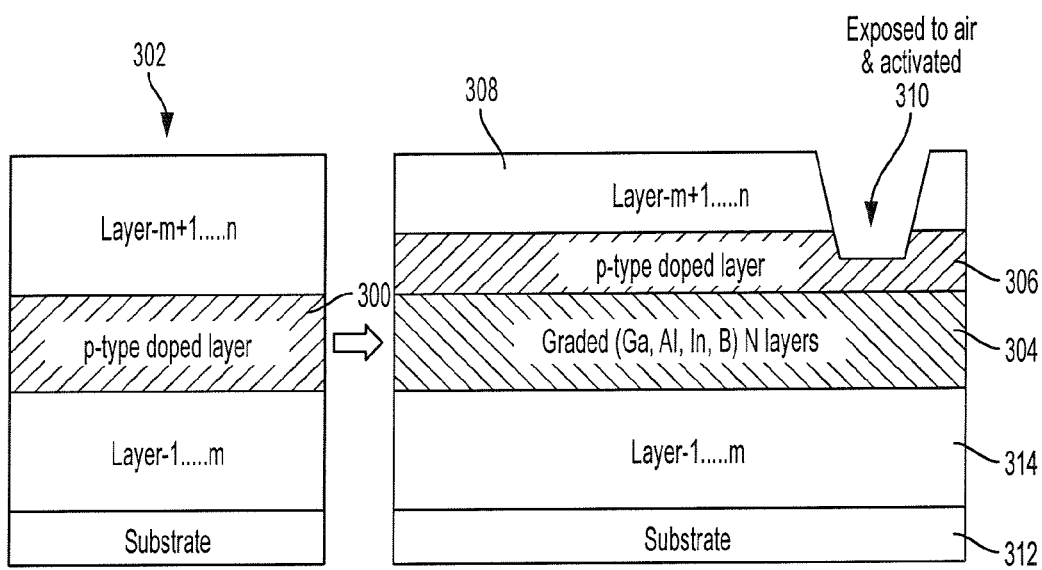
Cross-sectional view
Figure 3(a)
Cross-sectional view
Figure 3(b)
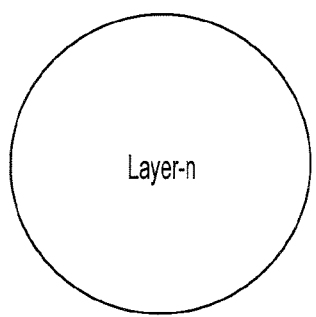
Top View
Figure 3(c)
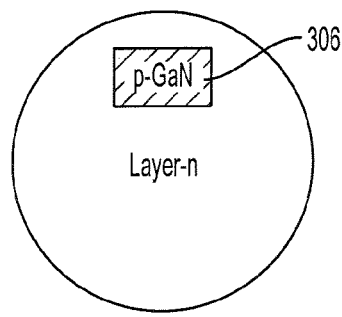
Top View
Figure 3(d)

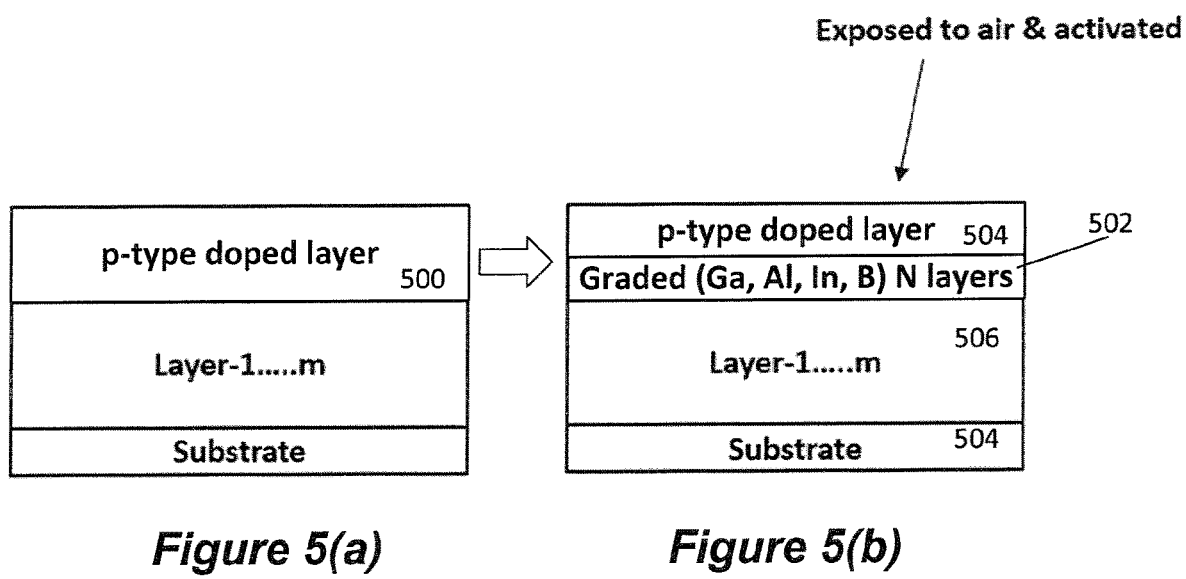
*Figure 5(a)* *Figure 5(b)*

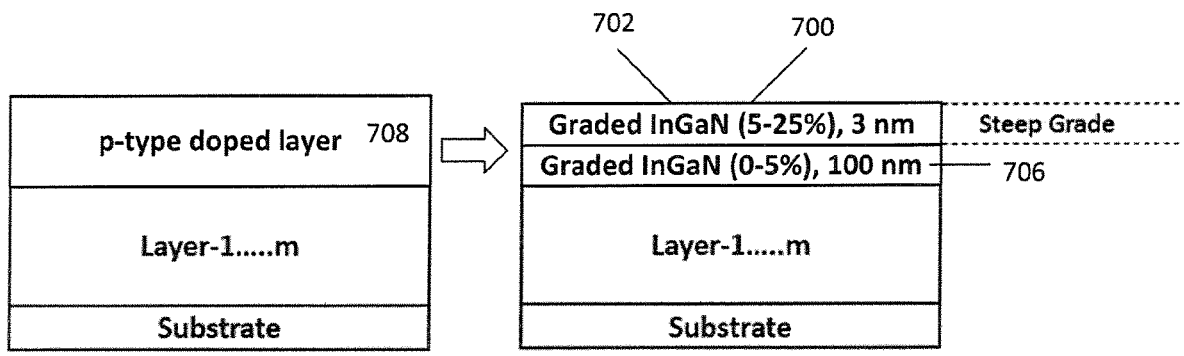
*Figure 7(a)*    *Figure 7(b)*
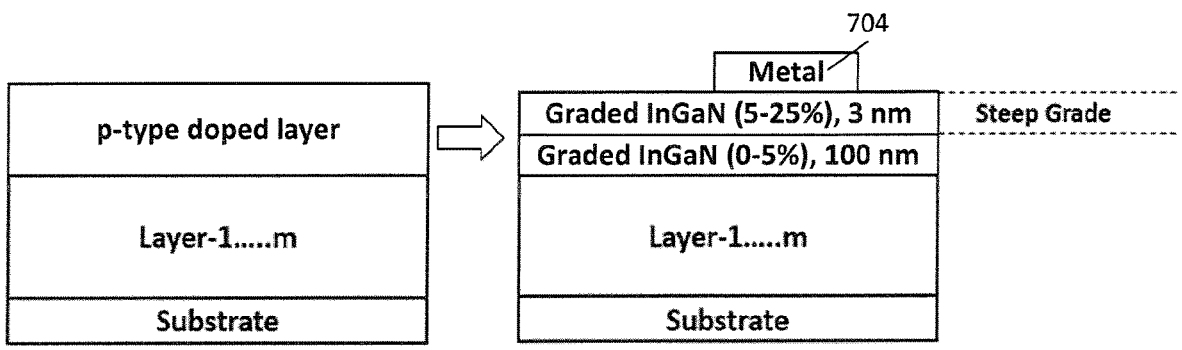
*Figure 7(c)*    *Figure 7(d)*

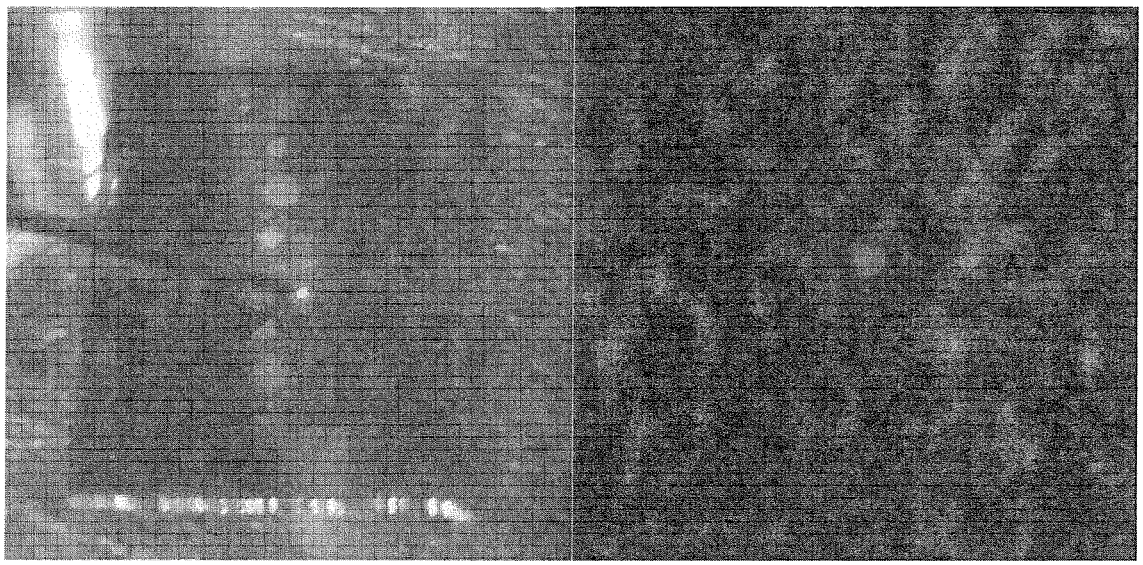
*Figure 10(a)*     *Figure 10(b)*

*Figure 12(a)* *Figure 12(b)*
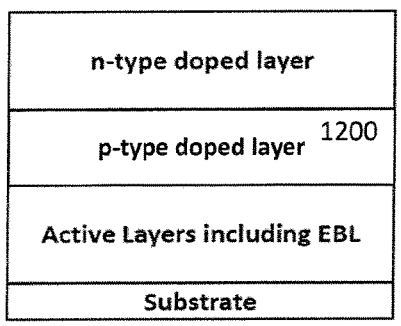
Cross-sectional view
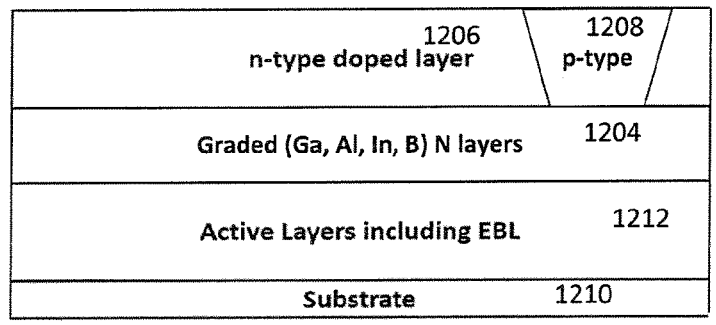
Cross-sectional view
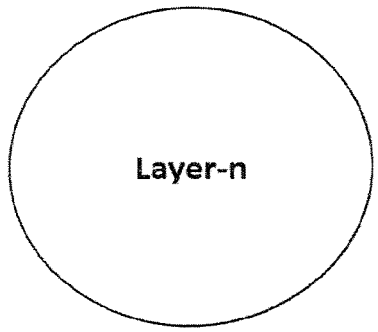
Top View
*Figure 12(c)*
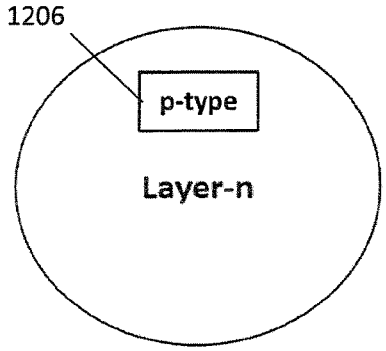
Top View
*Figure 12(d)*

*Figure 13(a)* 
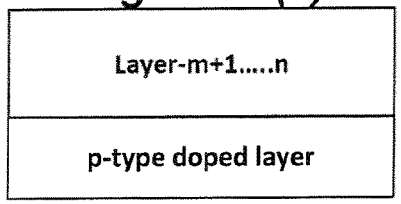
*Figure 13(b)*
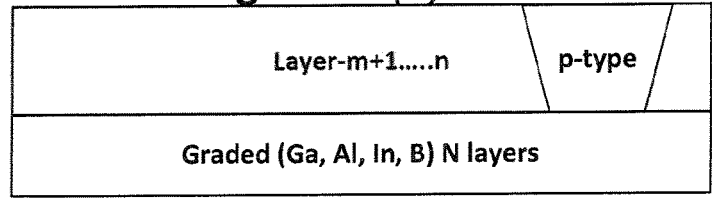
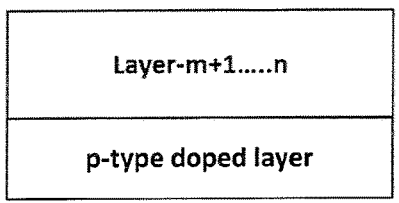
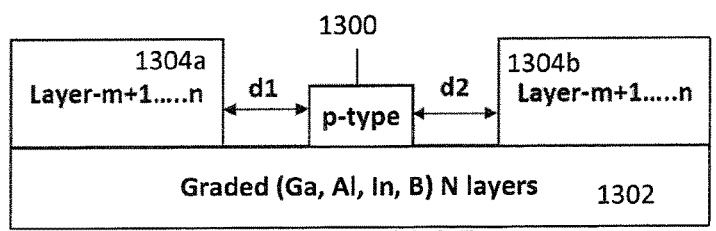
*Figure 13(c)*
*Figure 13(d)*

Figure 14(a)
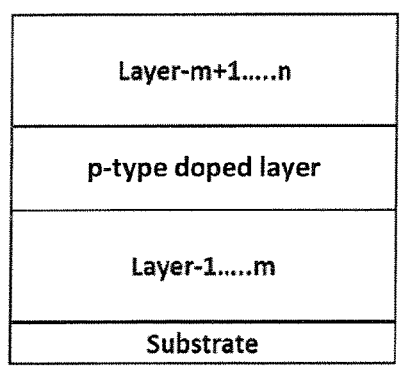
Cross-sectional view
Figure 14(b)
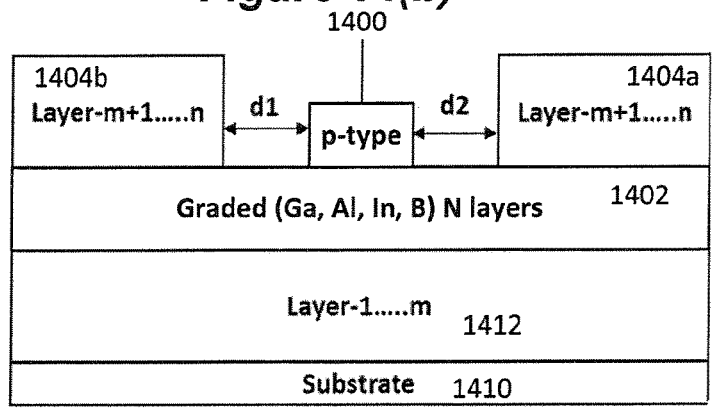
Cross-sectional view
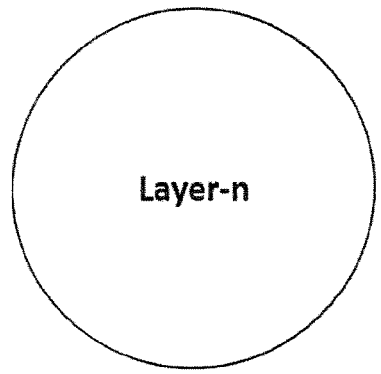
Top View
Figure 14(c)
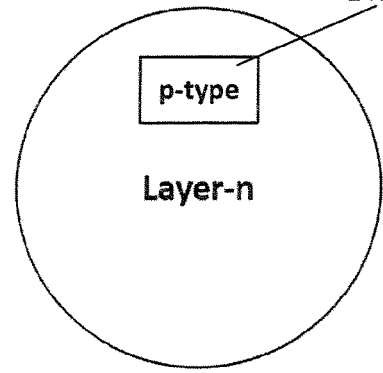
Top View
Figure 14(d)

*Figure 15(a)*
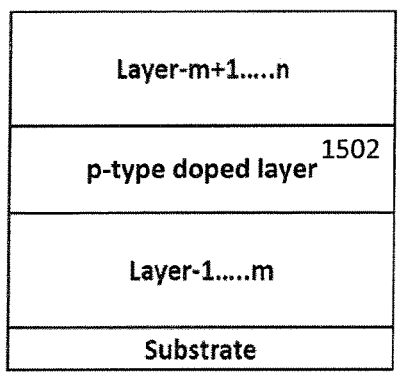
Cross-sectional view
*Figure 15(b)*
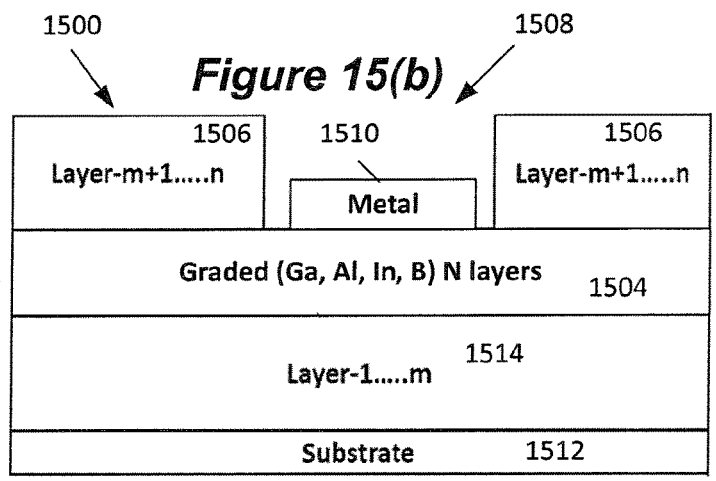
Cross-sectional view
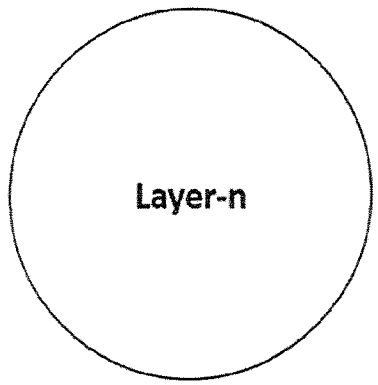
Top View
*Figure 15(c)*
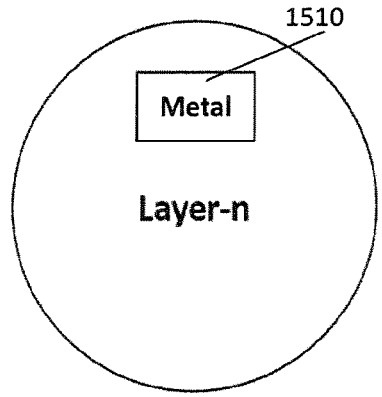
Top View
*Figure 15(d)*

Top View

Top View

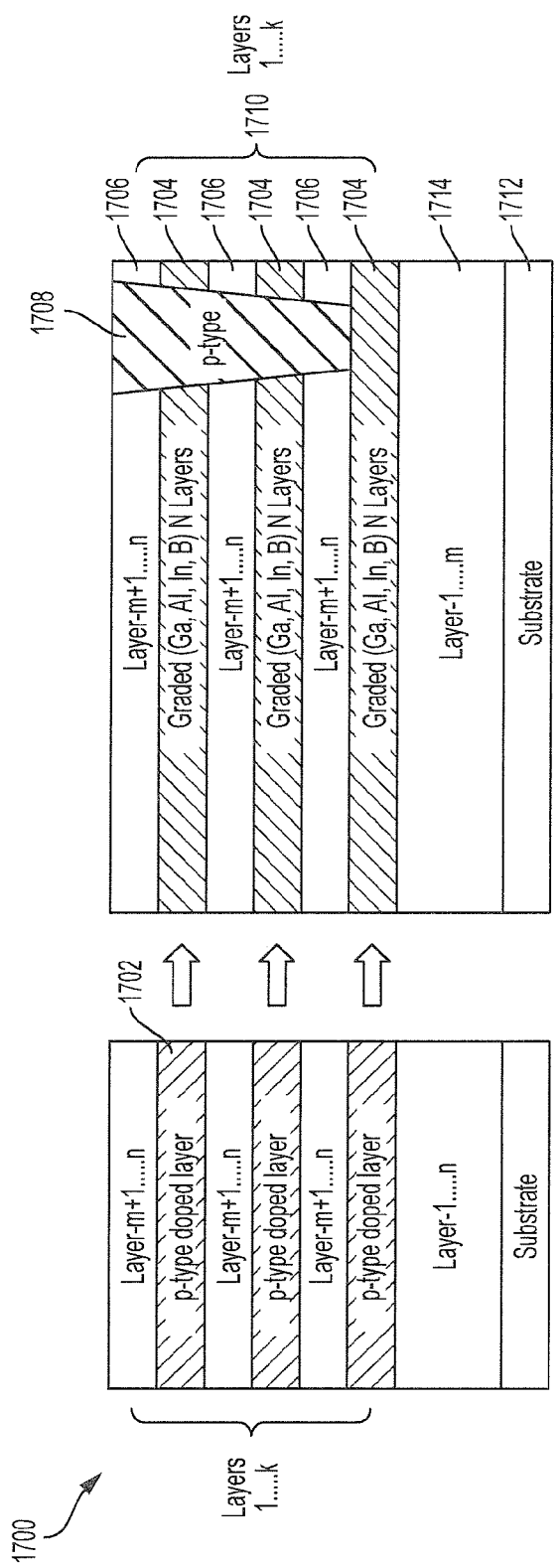
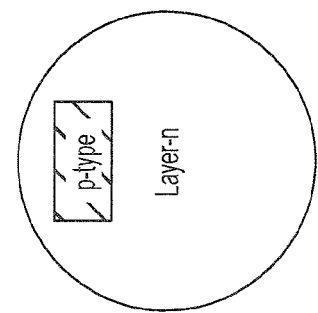
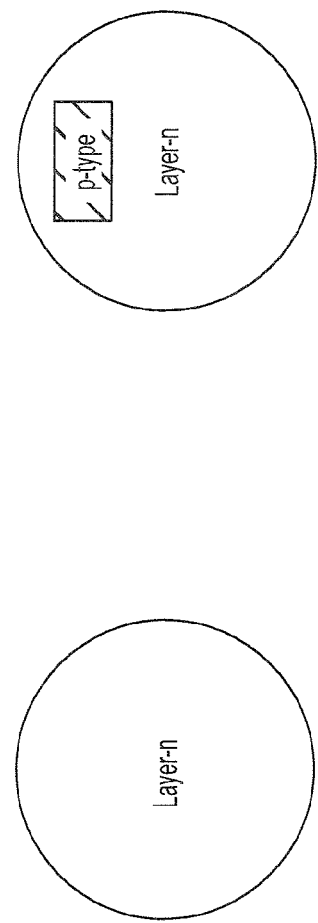
Figure 17(a)
Figure 17(b)
Figure 17(c)
Figure 17(d)

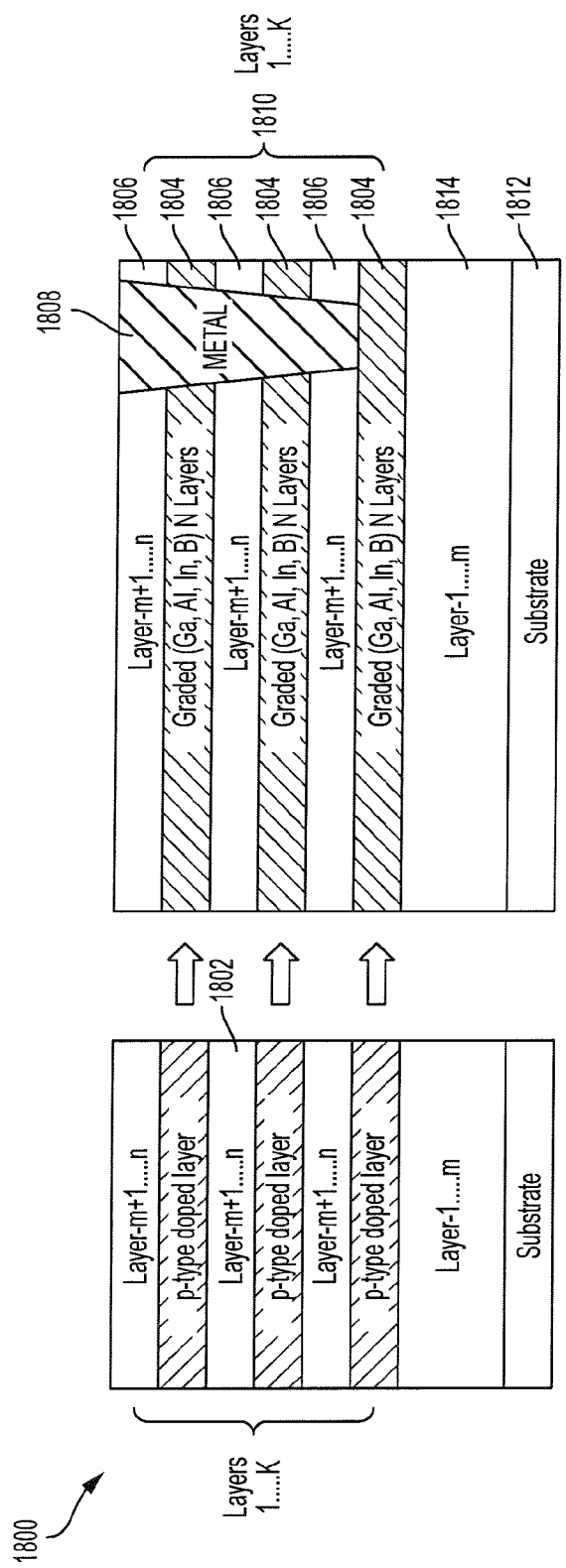
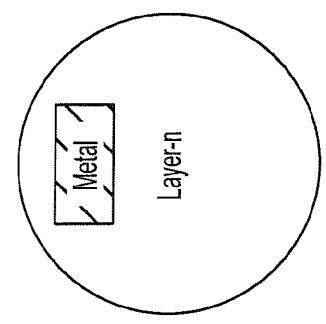
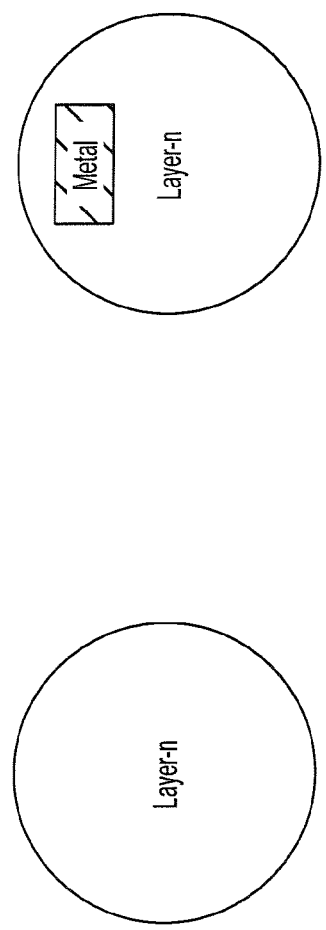
Figure 18(a)
Figure 18(b)
Figure 18(c)
Figure 18(d)

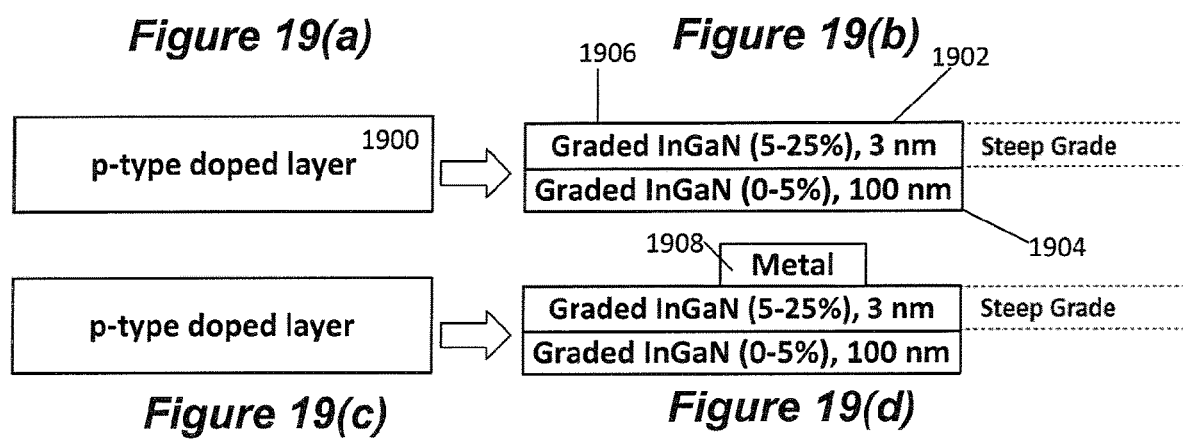

Figure 22(a)
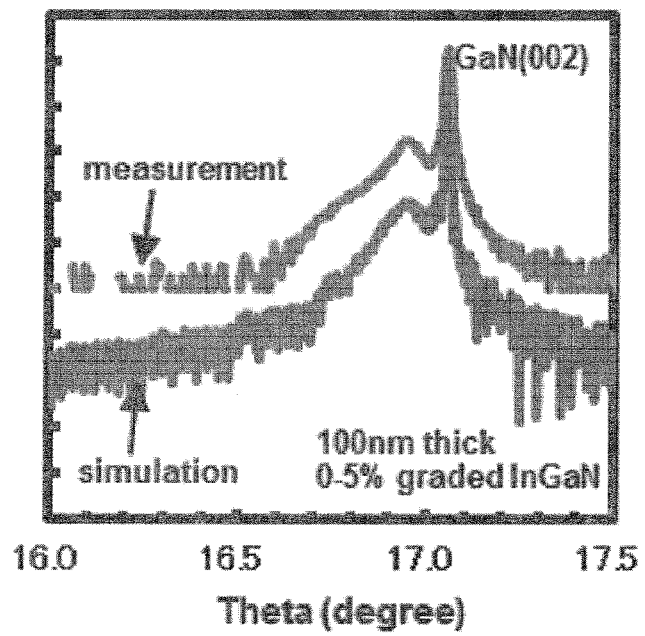
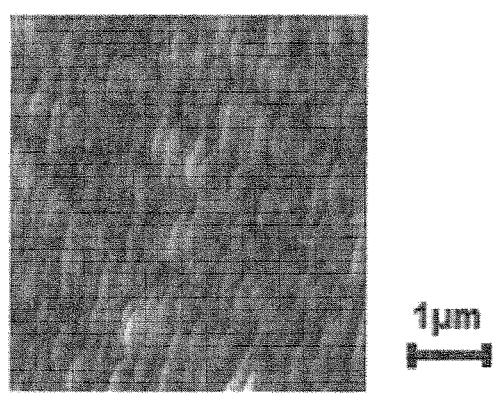
Figure 22(b)

Figure 22(c)
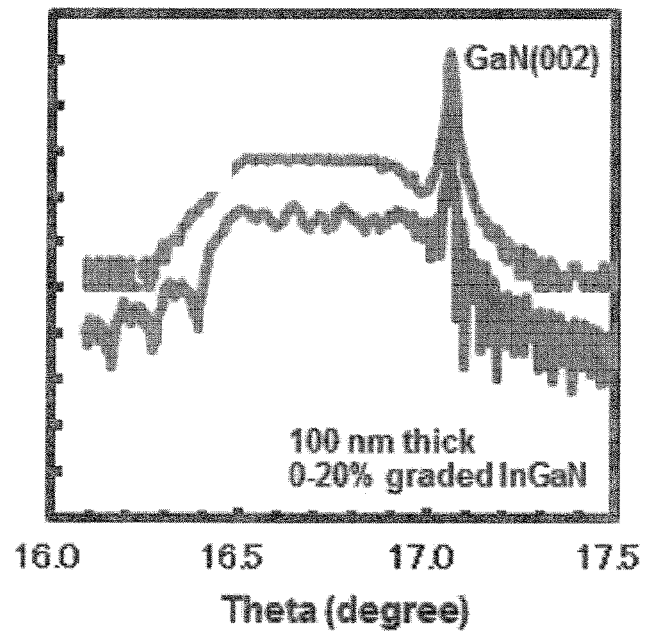
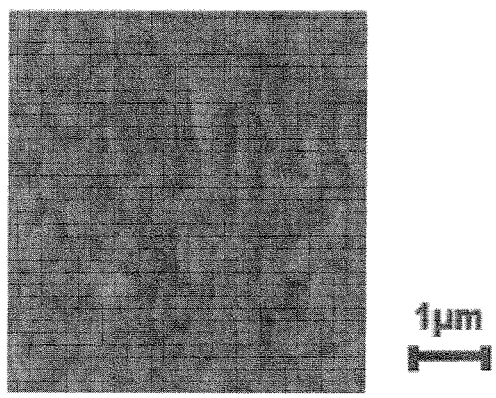
Figure 22(d)

*Figure 22(e)*
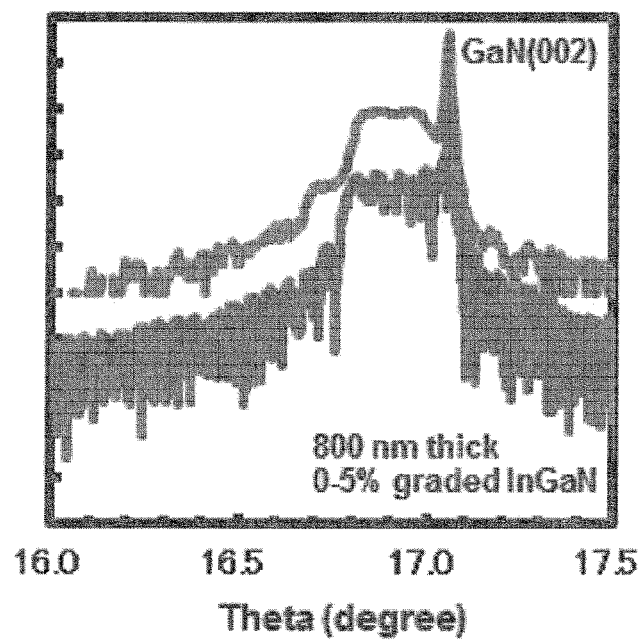
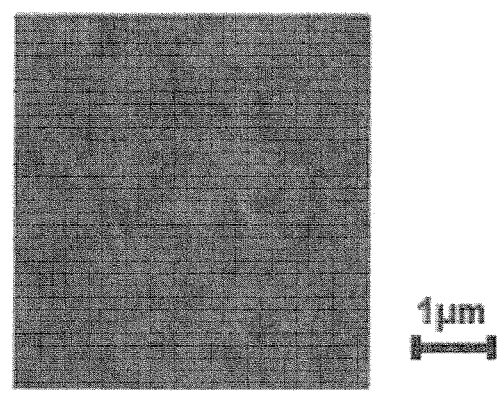
*Figure 22(f)*

METHOD TO ACHIEVE ACTIVE P-TYPE LAYER/LAYERS IN III-NITRTDE EPITAXIAL OR DEVICE STRUCTURES HAVING BURIED P-TYPE LAYERS

CROSS REFERENCE TO RELATED APPLICATIONS

This application claims the benefit under 35 U.S.C. Section 119(e) of the following and commonly-assigned applications:

U.S. Provisional Patent Application No. 62/321,194, filed on Apr. 11, 2016, by Yuuki Enatsu, Chirag Gupta, Stacia Keller, and Umesh Mishra, entitled "METHOD TO ACHIEVE ACTIVE P-TYPE LAYER/LAYERS IN III-NITRIDE EPITAXIAL OR DEVICE STRUCTURES HAVING BURIED P-TYPE LAYERS,"; and U.S. Provisional Patent Application No. 62/415,807, filed on Nov. 1, 2016, by Chirag Gupta, Anchal Agarwal, Umesh Mishra, and Stacia Keller, entitled "METHOD TO ACHIEVE TUNNEL JUNCTION LED AND LASER IN III-NITRIDE BY METAL ORGANIC CHEMICAL VAPOR DEPOSITION (MOCVD),";

all of which applications are incorporated by reference herein.

This application is related to the following co-pending and commonly-assigned U.S. patent applications:

U.S. patent application Ser. No. 15/344,377, filed on Nov. 4, 2016, by Srabanti Chowdhury, Jeonghee Kim, Chirag Gupta, Stacia Keller, Silvia H. Chan, and Umesh K. Mishra, entitled "TRENCHED VERTICAL POWER FIELD EFFECT TRANSISTORS WITH IMPROVED ON-RESISTANCE AND BREAKDOWN VOLTAGE," (2014-718) which application:

claims the benefit under 35 U.S.C. Section 119(e) of U.S. Provisional Patent application Ser. No. 62/250,741 filed Nov. 4, 2015 by Chirag Gupta, Umesh K. Mishra, Silvia H. Chan, and Stacia Keller, entitled "DEVICE STRUCTURE TO ACHIEVE ENHANCEMENT MODE OPERATION ALONG WITH LOW ON-RESISTANCE AND HIGH BREAKDOWN VOLTAGE IN A SEMICONDUCTOR DEVICE,";

is a continuation in part of PCT international application No. PCT/US15/31041, filed May 15, 2015, by Srabanti Chowdhury, Jeonghee Kim, Chirag Gupta, Stacia Keller and Umesh K. Mishra, entitled "TRENCHED VERTICAL POWER FIELD-EFFECT TRANSISTORS WITH IMPROVED ON-RESISTANCE AND BREAKDOWN VOLTAGE,", which application claims the benefit under 35 U.S.C. Section 119(e) of the following and commonly-assigned U.S. Provisional patent applications:

U.S. Provisional Patent Application Ser. No. 61/993,759, filed on May 15, 2014, by Umesh Mishra, Stacia Keller, and Srabanti Chowdhury, entitled "GALLIUM NITRIDE (GAN) BASED VERTICAL METAL OXIDE SEMICONDUCTOR (MOS) TRANSISTORS AND JUNCTION FIELD EFFECT TRANSISTORS (JFETS)";

U.S. Provisional Patent Application Ser. No. 62/075,556, filed on Nov. 5, 2014, by Srabanti Chowdhury, Chirag Gupta, Stacia Keller and Umesh K. Mishra, entitled "SUPERJUNCTION CURRENT APERTURE VERTICAL ELECTRON TRANSISTOR FOR ULTRA-LOW ON-RESISTANCE"; and U.S. Provisional Patent Application Ser. No. 62/075,560, filed on Nov. 5, 2014, by Jeonghee Kim, Stacia Keller, Srabanti Chowdhury and Umesh K. Mishra, entitled "TRENCHED VERTICAL POWER FIELD-EFFECT TRANSISTORS WITH IMPROVED ON-RESISTANCE AND BREAKDOWN VOLTAGE";

all of which applications are incorporated by reference herein.

BACKGROUND OF THE INVENTION

1. Field of the Invention

The present invention is related to methods and devices achieving active p-type layers.

2. Description of the Related Art (Note: This application references a number of different references as indicated throughout the specification by one or more reference numbers in brackets, e.g., [x]. A list of these different references ordered according to these reference numbers can be found below in the section entitled "References." Each of these references is incorporated by reference herein.)

There is a need in the art for methods and structures for improving the performance of III-nitride devices. The present invention satisfies this need.

SUMMARY OF THE INVENTION

One or more embodiments of the present invention allow for the first time both surface and buried p-type regions without the need for doping the materials with an acceptor. Here, material polarization in a graded layer is used to create regions of negative charge. Holes are extracted from separate regions to neutralize the negative charge. These regions could be regions doped with acceptors, or also metals, or a combination thereof.

Furthermore, illustrative embodiments of the present invention allow, for the first-time, tunnel junction device epitaxial layers to be entirely grown via Metal Organic Chemical Vapor Deposition (MOCVD). A tunnel junction is formed between the graded region and an n type region which may or may not be graded itself. Current flow across the junction occurs from the conduction band of then region to the valence band of the graded region. The graded region may be connected to a separate region from which holes could be extracted. These regions could be regions doped with acceptors, or also metals, or a combination thereof, or a component of another tunnel junction. These separate regions may or may not be active regions.

An illustrative embodiment comprises depositing a polar p region, or active region comprising a polar p region, on or above a polar substrate, wherein the polar p region (e.g., polar p-type region) includes a graded layer/region having a polar orientation or a region with an abrupt interface or a series of multiple interfaces. A hole supply region is deposited on, above, or below the polar p region. Holes in the hole supply region are driven by a field into the active region and the field comprises or arises at least in part due to a piezoelectric and/or spontaneous polarization field generated by the polar p region (e.g., a composition and grading of the graded layer).

The method can comprise depositing one or more layers on the polar p region; at least partially etching one or more of the layers to form an etched region; and depositing the hole supply region, comprising a doped p-type region, in the etched region.

The method can comprise depositing one or more layers on the hole supply region, the hole supply region comprising a p-type region; at least partially etching the p-type region and one or more of the layers to form an etched region; and activating the p-type region in the etched region. The method can further comprise growing a further p-type region in the etched region, wherein the activating comprises activating the p-type region grown in the etched region.

The hole supply region can comprise a p-type region that is etched or selectively regrown so that it does not completely cover the graded layer.

In one or more embodiments, the layers on the polar p region or the hole supply region are III-nitride layers, and the p-type region and/or the further p-type region are p-type GaN. The hole supply region can comprise or consist essentially of metal such as gold, silver, titanium, nickel, palladium, platinum, etc. In one embodiment comprising a device structure that does not include a p-type doped region, the graded layer comprises a steep grade adjacent the metal, the steep grade enabling tunneling of holes from the metal into the active region.

The holes driven into the graded layer/polar p region can form a hole gas in the graded III-nitride active region of a variety of devices. For example, the hole gas can be the gated channel in a field effect transistor or a current aperture vertical electron transistor. In another example, the holes driven into the active region of the light emitting diode recombine with electrons in the active region to emit the light emitted by the light emitting device or diode.

In various examples, a thickness and doping of the hole supply region, and composition and grading of the graded layer in the active region, can be selected (1) such that the field creates a negative charge of e.g., at least $8 \times 10^{19}$ cm$^{-1}$ in the active region, (2) such that the field creates a hole density of e.g., at least $10^{19}$ cm$^{-3}$ in the active region, and/or (3) to obtain a desired hole concentration in the active region, e.g., such that a diode comprising the device structure has a turn on voltage of no more than 5.0 Volts, and/or such that the holes neutralize at least 20%, at least 50%, or at least 90% of the negative charge created by the field.

One or more embodiments of the present invention further disclose a light emitting diode, comprising a device structure including an active region, wherein the active region comprises graded polar materials and has a polar orientation; and a hole supply region, wherein holes in the hole supply region are driven by a field into the active region, the field arising at least in part due to a piezoelectric and/or spontaneous polarization field generated by a composition and grading of the active region.

The LED can be an inverted LED with the p-GaN layer not at the surface. For example, the device can comprise an inverted or flip-chip light emitting diode and the hole supply region can be a p-GaN layer buried beneath a surface of the light emitting diode. For example, the p-GaN layer can be between the active region and a substrate, submount, or sacrificial substrate, and the active region can be between the p-GaN layer and an n-type GaN layer.

Further examples of the devices enabled by one or more embodiments of the invention include Light Emitting Diodes (LEDs) without acceptor doping in the active p-type region (p-region), buried active p-regions and devices based on this availability, such as tunnel junction based LEDs and lasers, and vertical electronic devices that need buried p-regions, such as Current Aperture Vertical Electron Transistors (CAVETs), Trench Metal Oxide Semiconductor Field Effect Transistors (MOSFETs), and super-junction devices.

BRIEF DESCRIPTION OF THE DRAWINGS

Referring now to the drawings in which like reference numbers represent corresponding parts throughout:

FIG. 1 illustrates a method and device structure according to a first embodiment of the present invention.

FIG. 2 illustrates a method and device structure according to a second embodiment of the present invention.

FIG. 3 illustrates a method and device structure according to a third embodiment of the present invention.

FIG. 5 illustrates a method and device structure according to a fifth embodiment of the present invention.

FIGS. 7(a)-7(d) illustrate methods to fabricate acceptor free device structures according to embodiments of the present invention.

FIGS. 10(a)-10(b) illustrate emission from the device structure of FIG. 9.

FIGS. 12(a)-12(d), 13(a)-13(d) and 14(a)-14(d) are cross sectional schematics illustrating devices according to one or more embodiments of the present invention wherein the hole supplying region is a p-type region.

FIGS. 15(a)-15(d) and 16(a)-16(d) are cross sectional schematics illustrating devices according to one or more embodiments of the present invention wherein the hole supplying region is a metal region.

FIGS. 17(a)-17(d) show cross-sectional schematics illustrating devices according to one or more embodiments of the present invention wherein the hole supplying region is a p-type region in contact with multiple graded III-nitride layers.

FIGS. 18(a)-18(d) show cross-sectional schematics illustrating devices according to one or more embodiments of the present invention wherein the hole supplying region is a metal region in contact with multiple graded III-nitride layers.

FIGS. 19(a)-19(d) show cross-sectional schematics illustrating devices according to one or more embodiments of the present invention wherein the hole supplying region is a metal region and the graded III-nitride layer includes a sharp grade.

FIGS. 22(a)-22(f) show structural properties and surface morphologies of the compositionally un-doped graded In$_x$Ga$_{1-x}$N layers. (a)-(c) Triple axis x-ray diffraction scans: (top line) measurement data (bottom line) simulation data. (d)-(f) AFM images of the compositionally un-doped graded In$_x$Ga$_{1-x}$N layer. The scan area is 5×5 μm$^2$.

DETAILED DESCRIPTION OF THE INVENTION

Figures 4A, 4B:
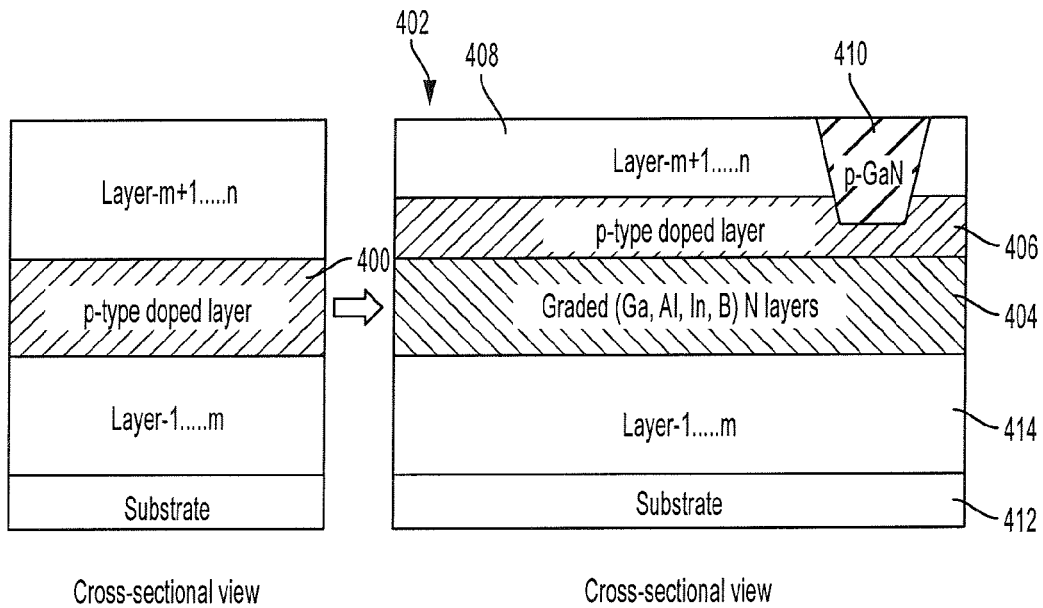
FIG. 4 illustrates a method and device structure according to a fourth embodiment of the present invention.
Figures 4, 4D:
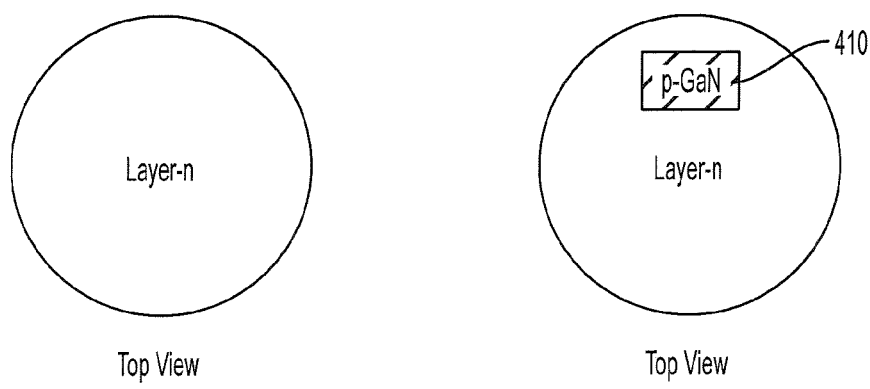
Figures 6A, 6B, 6C, 6D:
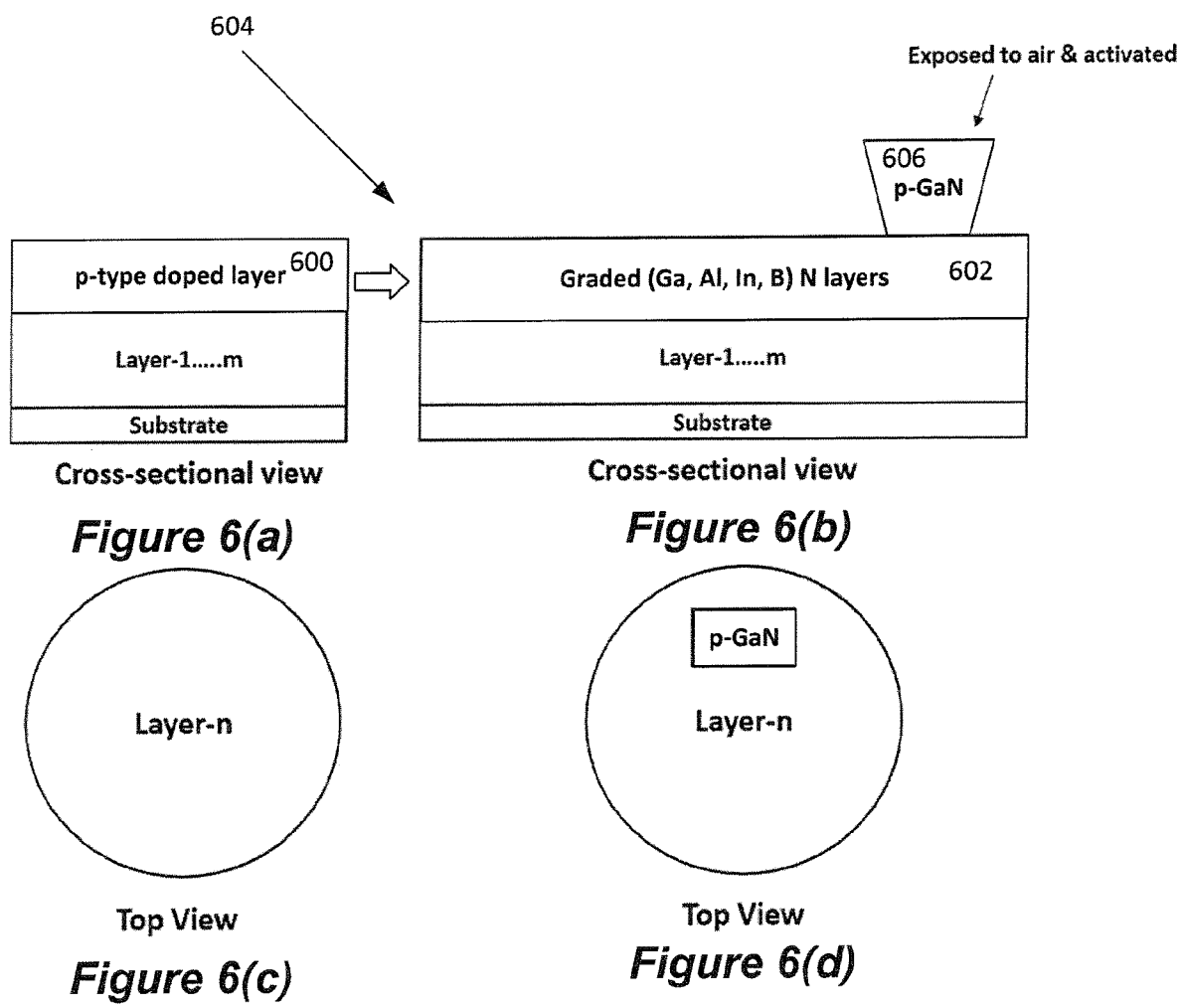
FIG. 6 illustrates a method and device structure according to a sixth embodiment of the present invention.

In the following description of the preferred embodiment, reference is made to a specific embodiment in which the invention may be practiced. It is to be understood that other embodiments may be utilized and structural changes may be made without departing from the scope of the present invention.

Technical Description

It is desirable to remove the need for high quality Magnesium (Mg) doped regions to produce p-type regions in photonic devices such as III-N based light emitters and detectors. The reason is that high quality p-GaN has to be grown at higher temperatures than what some of the constituent materials in the device stack would like to be subjected to. In addition, it is difficult to achieve high hole concentrations, because Mg is a relatively deep acceptor with an activation energy of ~110-160 meV in GaN (and even higher values in AlGaN, for example).

In recent times, vertical GaN power devices have also gained increased attention, owing to their potential to provide higher breakdown voltage without increasing specific on-resistance. Numerous vertical GaN power devices/transistors have been demonstrated in the past few years [1-9]. Almost all of the above listed GaN power devices utilize a buried p-GaN layer for various purposes, namely normally-off operation, threshold voltage control, high breakdown voltage, and reduction in source-drain leakage, etc. However, these devices suffer from the inefficiency of dopant based p-type doping in buried p-GaN layers. For example, the p-type doped concentration cannot be increased sufficiently in U-MOSFET type devices [5-9], because the p-type GaN layer is located close to the channel. The high activation energy of the most commonly used p-type dopant, Mg (in GaN, ~160 meV), results in only about 1% ionization of Mg atoms at room temperature. This problem is exacerbated by passivation of the dopant (Mg) by forming complexes with hydrogen during regrowth or processing steps. This severely impedes device design, growth and fabrication space.

As described herein, using polarization to create negative charges, that are then neutralized by holes from a hole supplying region, is a breakthrough that can improve photonic device efficiencies across the spectrum of light emission as well as improve the performance of electronic devices.

It is an object of the present invention to provide a method to achieve active p-active buried p-layers in polar materials, including but not limited to III-nitride device structures, and also create a new class of light emitters and electronic devices with p-doped regions and metals used only for hole supply and separated from p-active regions.

Active buried p-GaN layers can be achieved by utilizing the unique property of III-N material systems having piezoelectric and/or spontaneous polarization fields on polar planes. By engineering these polarization fields, a three dimensional electron or hole gas is achieved, which can result in dopant-free doping of III-N layers. The doping and polarity of the charge can be controlled by choosing suitable alloy composition and grading.

First Example

FIGS. 1(a)-1(b) illustrate the p-type doped layer 100 in the epitaxial stack 102 is replaced by one or multiple graded (Ga,Al,In,B)N layers 104 followed by a p-type doped layer 106. The p-type doped layer 104, if passivated, is then activated by usual p-GaN activation techniques such as thermal annealing. The active p-type doped layer 106 provides holes to the graded (Ga,Al,In,B)N layers 102, resulting in the graded (Ga,Al,In,B)N 102 acting as an active p-type GaN (p-GaN) layer or a graded p-(Ga,Al,In,B)N. The holes present in the graded (Ga,Al,In,B)N layers are field-driven into the graded layers 104 from the active p-type doped layer 106 and need not contain the dopant species. This allows the graded (Ga,Al,In,B)N layers 104 to remain active even after subsequent re-growths in a hydrogen rich environment. The substrate 108, one or more layers 110 or 1 . . . m between the substrate 108 and graded layer 104, and one or more layers 112 or −m+1 . . . n are also shown. Layer m+1 . . . n indicates n layers where n is an integer and layer 1 . . . m indicates m layers where m is an integer.

Second Example

FIGS. 2(a)-2(d) illustrate the p-type doped layer 200 in the epitaxial stack 202 is replaced by one or multiple graded (Ga,Al,In,B)N layers 204 followed by the rest of desired epitaxial structure 206, resulting in buried graded (Ga,Al,In,B)N layers 204. Thereafter, the layers 206 deposited/grown above graded (Ga,Al,In,B)N layers are selectively removed/etched from a part of (or completely from) the wafer so as to form an etched region 208. Subsequently, in the etched region 208, doped p-GaN 210 is regrown and activated. The active p-type doped layer 210 provides holes to the buried graded (Ga,Al,In,B)N layers 204, resulting in the graded (Ga,Al,In,B)N 204 acting as an active p-GaN layer or an active p-(Ga,Al,In,B)N layer throughout the entire wafer 202. The substrate 212 and one or more layers 214 or 1 . . . m are also shown.

Third Example

FIGS. 3(a)-3(d) illustrate the p-type doped layer 300 in the epitaxial stack 302 is replaced by one or multiple graded (Ga,Al,In,B)N layers 304 followed by a p-type doped layer 306. The p-type doped layer 306 may or may not be activated. Subsequently, the rest of the desired epitaxial structure 308 is grown/deposited, resulting in buried graded (Ga,Al,In,B)N 304 and p-type doped layers 306. Thereafter, the layers 308 deposited/grown above p-type doped layer and a part of (or complete) p-type doped layer are selectively removed/etched from a part of (or completely from) the wafer 302 to form an etched region 310 exposed to air. Subsequently, in the etched region 310, the remaining part of the doped p-GaN 306 is activated. Thus, the active p-type doped layer 306 would provide holes to the buried graded (Ga,Al,In,B)N layers 304, resulting in the graded (Ga,Al,In,B)N 304 acting as an active p-GaN layer or an active p-(Ga,Al,In,B)N layer throughout the entire wafer 302. The p-type doped layer 306 is added in this structure to simplify processing complexity.

The substrate 312 and one or more layers 314 or 1 ... m between the substrate 312 and graded layer 304 are also shown.

Fourth Example

FIGS. 4(a)-4(d) illustrate the p-type doped layer 400 in the epitaxial stack 402 is replaced by one or multiple graded (Ga,Al,In,B)N layers 404 followed by a p-type doped layer 406. The p-type doped layer 406 may or may not be activated. Subsequently, the rest of the desired epitaxial structure 408 is grown/deposited resulting in buried graded (Ga,Al,In,B)N 404 and p-type doped layers 406. Thereafter, the layers 408 deposited/grown above p-type doped layer 406 and a part of (or complete) p-type doped layer 406 are selectively removed/etched from a part of (or completely from) the wafer 402. Subsequently, in the etched region, doped p-GaN 410 is regrown and activated. The active p-type doped layer 410 provides holes to the buried graded (Ga,Al,In,B)N layers 404, resulting in the graded (Ga,Al,In,B)N 404 acting as an active p-GaN or an active p-(Ga,Al,In,B)N layer 404 throughout the entire wafer 402. The p-type doped layer 406 is added in this structure to simplify processing complexity. The substrate 412 and one or more layers 414 or 1 ... m between the substrate 412 and graded layer 404 are also shown.

Fifth Example

FIGS. 5(a)-5(b) illustrate, in order to achieve the active surface layer, the p-type doped layer 500 is replaced by one or multiple graded (Ga,Al,In,B)N layers 502 followed by a p-type doped layer 504 (which may be exposed to air). The p-type doped layer 504, if passivated, is then activated by usual p-GaN activation techniques such as thermal annealing. The active p-type doped layer 504 provides holes to the graded (Ga,Al,In,B)N layers 502, resulting in the graded (Ga,Al,In,B)N 502 acting as an active p-GaN layer or an active p-(Ga,Al,In,B)N layer 502. The holes present in the graded (Ga,Al,In,B)N layers 502 are field-driven into the graded layers from the active p-type doped layer and the graded layer does not need to contain the dopant species.

The substrate 504 and one or more layers 506 or 1 ... m between the substrate 504 and graded layer 502 are also shown.

Sixth Example

FIGS. 6(a)-6(d) illustrate the p-type doped layer 600 is replaced by one or multiple graded (Ga,Al,In,B)N layers 602 in order to achieve the active surface layer. Thereafter, the layers deposited/grown above graded (Ga,Al,In,B)N layers 602 are selectively removed/etched from a part of (or completely from) the wafer 604. Subsequently, doped p-GaN 606 is regrown and activated either selectively on a part of, or completely on, the wafer 604. The selectively regrown active p-type doped layer 606 confined to a particular region provides holes to the graded (Ga,Al,In,B)N layers 602, resulting in the graded (Ga,Al,In,B)N 602 acting as an active p-GaN layer or an active p-(Ga,Al,In,B)N layer throughout the entire wafer 604. The p-GaN 606 may be exposed to air.

Seventh Example

In another embodiment of the invention, the graded materials could have multiple graded junctions with different grading profiles to provide varying hole concentrations related to the nature of the grading profile.

Figure 9:
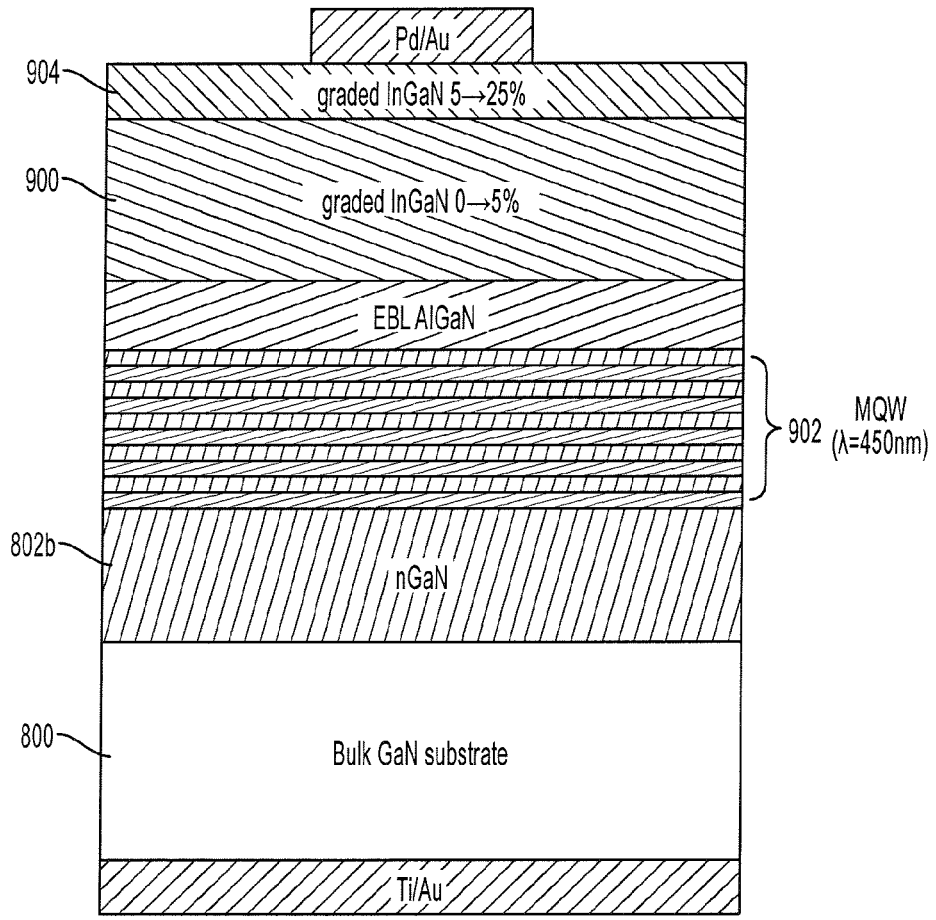
FIG. 9 illustrates a device structure, and performance, of a light emitting diode fabricated according to one or more embodiments of the present invention.
Figure 11A:
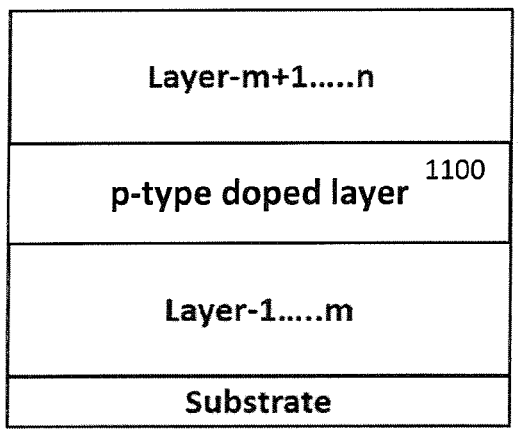
FIGS. 11(a)-11(d) illustrate cross-sections of tunnel junction LED structures according to one or more embodiments of the invention.
Figure 11B:
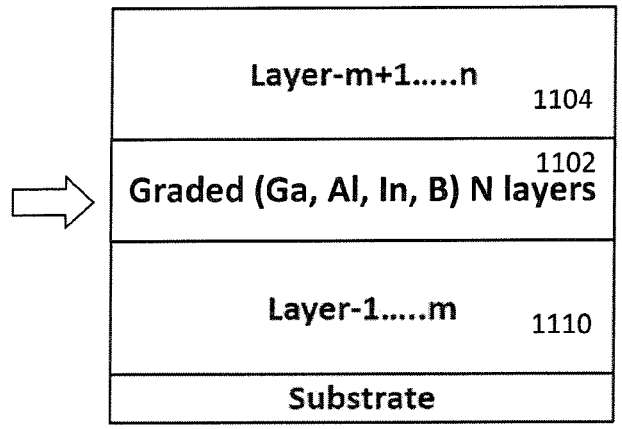
Figure 11C:
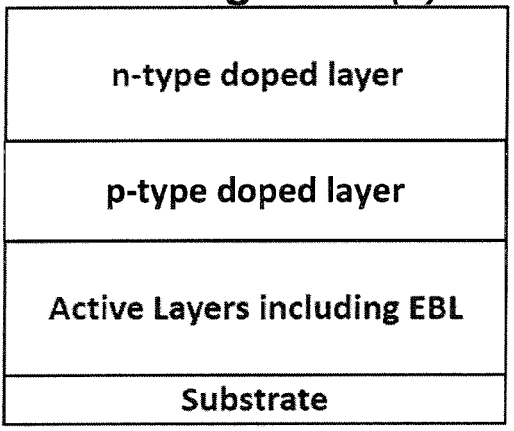
Figure 11D:
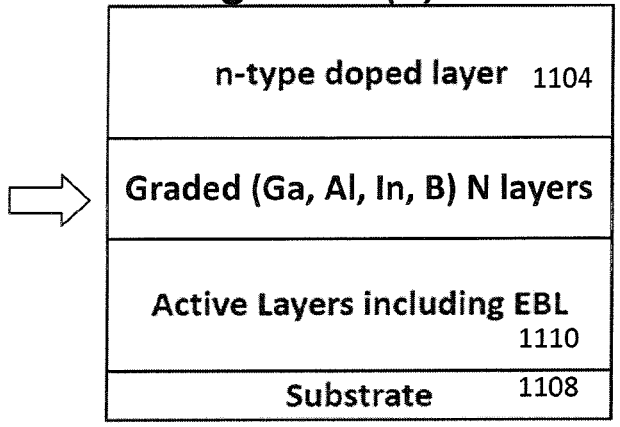
Figures 16A, 16B:
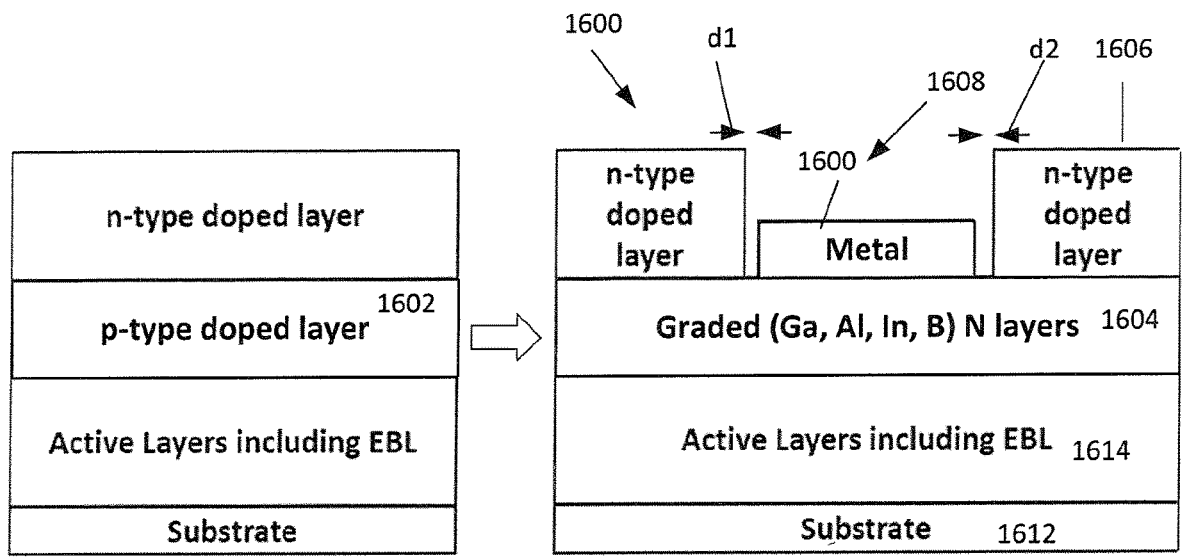
Figure 16C:
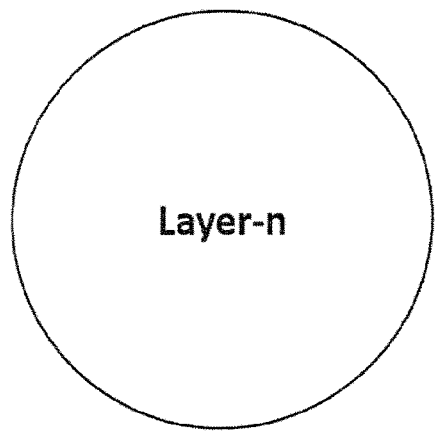
Figure 16D:
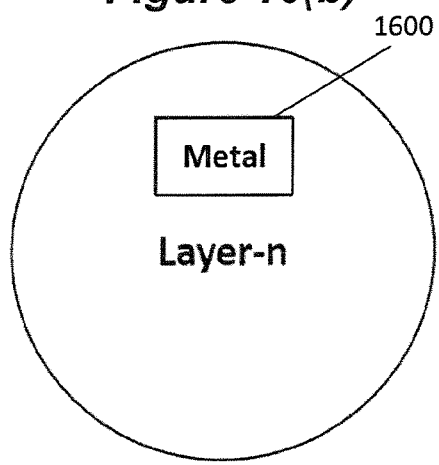

FIGS. 7(a)-7(d) illustrate one particular embodiment wherein a sharp grade 700 is incorporated adjacent to the surface 702 to enable tunneling of holes from the metals 704 into the graded regions 700, 706 directly without the need of a p-type doped region 708. FIG. 7(d) illustrates an acceptor free structure with holes (a new invention with multiple opportunities). Another example is also shown in FIG. 9.

Prototype Demonstration

Figure 8A:
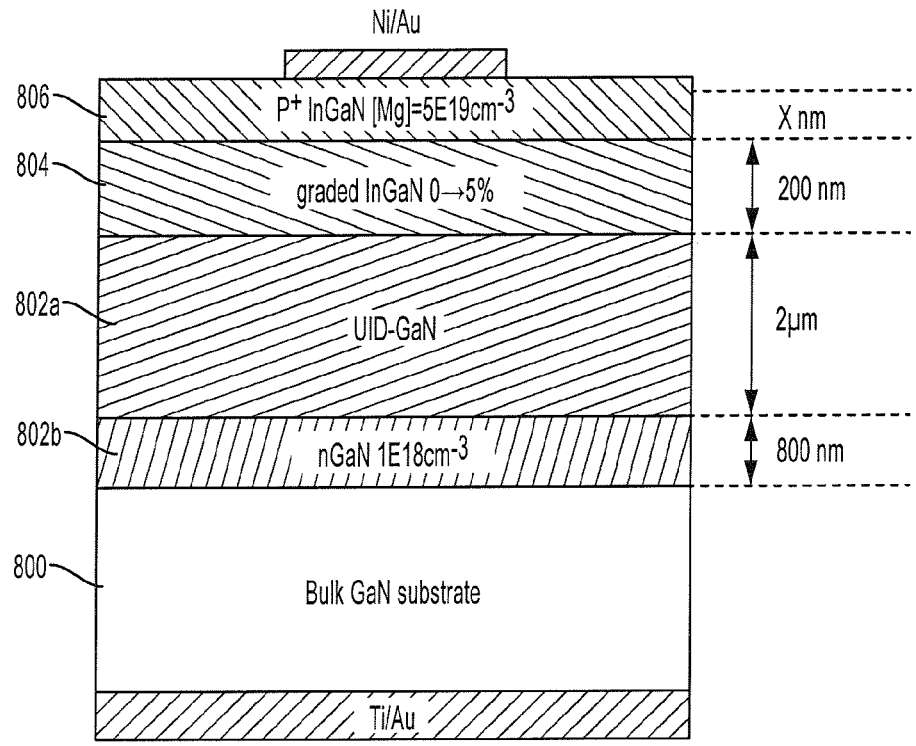
FIG. 8(a) illustrates a device structure according to one or more embodiments of the invention, and FIG. 8b) illustrates device performance of embodiments of the present invention.

FIG. 8(a) illustrates a device structure according to one or more embodiments of the invention, comprising Ti/Au contacts, bulk GaN substrate 800, UID GaN 802a, n-GaN 802b, graded InGaN 804, p⁺ InGaN 806, and Ni/Au contacts.

Figure 8B:
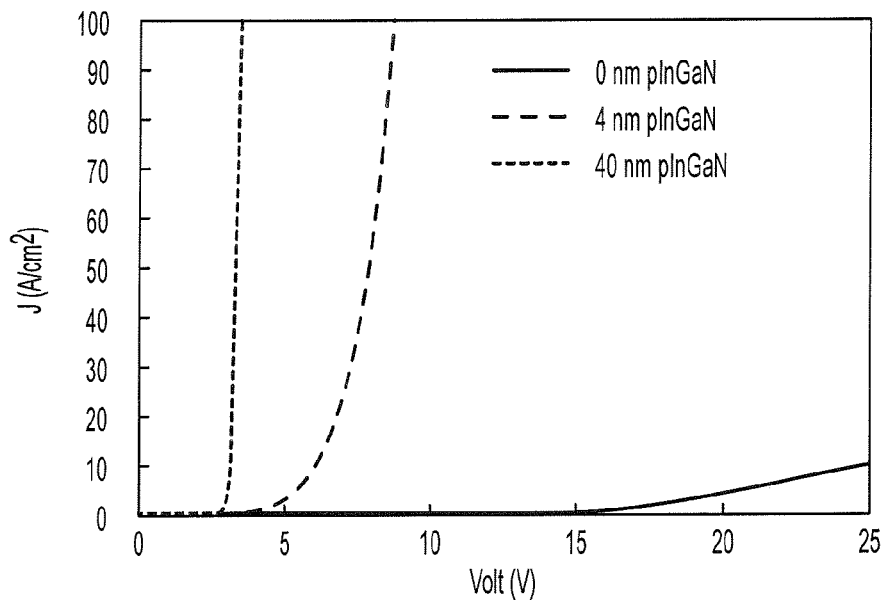

FIG. 8(b) illustrates one important demonstration, using semiconductor barriers 806 formed on a nominally graded III-N material 804 (in this case graded InGaN 804 grown on n-type GaN 802, wherein the graded InGaN 804 is graded from an In composition of 0% to 5% over a distance of 200 nm), showing three distinct regions of operation. A first device example, wherein the barrier is a metal layer Ni/Au formed directly (0 nm) on the graded region 804, exhibits low current and resistive characteristics. A second device example, comprising the barrier that is a 4 nm thick p-type material grown on the graded region 804, exhibits barrier limited current transport but with a high turn-on voltage of 6.8 volts. A third device example, comprising the barrier 806 that is a 40 nm thick p-type cap layer formed on the material stack as illustrated in FIG. 8(a), shows excellent barrier limited transport with an expected turn-on voltage of 3.2 volts. This shows that the p-type region needs to have and provide enough holes to satisfy/achieve near charge neutrality in the graded region.

FIG. 9 illustrates a second set of devices, wherein a two-step grade was employed with first a nominal 0-5% InGaN grade 900 over 100 nm grown on a conventional multi quantum well structure 902 used for blue LEDs. This layer 900 was followed by a sharper grade 904, from 5% In to 25% In over 3 nm, to generate an expected negative charge concentration of $8.1 \times 10^{19}$ cm$^{-3}$. No p-type region was grown and this structure was Mg-free. Pd/Au metal was deposited on the structure to form the LED. (See FIGS. 7(a)-7(d) for the material and device structure). As shown in the photo of FIG. 10(b), blue emission was obtained from the structure, verifying that electron-hole recombination was occurring in the LED active region and that the Mg-free structure was successful in producing holes.

Tunnel Junction Examples

In devices (such as photonic devices) it is desirable to remove the need for molecular beam epitaxy (MBE) growth on top active LED/Laser epitaxial layer structure in a tunnel junction Light Emitting Diode (LED). The MBE growth is required to keep the p-type doped region active. It is commonly known that during Metal Organic Chemical Vapor Deposition (MOCVD) growth of subsequent layers above p-type layer, the p-type dopant, Mg forms complex with hydrogen and gets passivated and therefore affects LED performance drastically. Partial activation by etching through top layers to the p-type layer is also insufficient to utilize the full potential of tunnel junction LED/Laser.

It is an object of the present invention to provide a method to achieve tunnel junction devices (e.g., LED, laser, or electronic devices) in III-nitride by metal organic chemical vapor deposition (MOCVD). Tunnel junction LEDs, lasers, and electronic devices could be achieved by utilizing the unique property of III-N material systems having piezoelectric and/or spontaneous polarization fields on polar planes. Here, material polarization is used to create regions of negative charge. A tunnel junction is formed between the graded region and an n type region which may or may not be graded itself. Current flow across the junction occurs from the conduction band of the n region to the valence band of the graded region. The graded region may be connected to a separate region from which holes could be extracted. These regions could be: regions doped with acceptors, metal regions, a combination thereof, or a component of another tunnel junction. These separate regions may or may not be active regions.

FIGS. 11(a)-11(d) a p-type doped layer 1100 is replaced by one or multiple graded (Ga,Al,In,B)N layers 1102. The doping, composition, and thickness of the layers 1102 can be modified/designed to achieve desirable device characteristics. In this structure, a tunnel junction is formed between the graded region 1102 and an n type region 1104 which may or may not be graded itself. Current flow across the junction occurs from the conduction band of then region 1104 to the valence band of the graded region 1102. The substrate 1108 and one or more layers 1110 (e.g., active layers including electron blocking layer (EBL)) between the substrate 1108 and graded region 1102 are also shown.

FIGS. 12(a)-12(d) illustrate a p-type doped layer 1200 in an epitaxial stack 1202 is replaced by one or multiple graded (Ga,Al,In,B)N layers 1204 followed by the rest of desired epitaxial structure (including n-type doped layer 1206), resulting in buried graded (Ga,Al,In,B)N layers 1204. Thereafter, the layers 1206 deposited/grown above graded (Ga,Al,In,B)N layers are selectively removed/etched from a part of (or completely from) the wafer 1202 to form an etched region. Subsequently, in the etched region, doped p-type material 1208 (which may or may not be III-N) is regrown and activated (if needed). The active p-type doped layer 1208 provides holes to the buried graded (Ga,Al,In,B)N layers resulting in graded (Ga,Al,In,B)N 1204 acting as the active p-GaN layer throughout the entire wafer. The substrate 1210 and one or more layers 1212 (e.g., active layers including electron blocking layer (EBL)) between the substrate 1210 and graded region 1204 are also shown.

FIGS. 13(a)-13(d) and 14(a)-14(d) show the regrown/re-deposited p-type layer 1300, 1400 on the graded layer 1302, 1402 may have a distance of $d_1$ and $d_2$ from two adjacent layers 1304a, 1304b, 1404a, 1404b. The value of $d_1$ and $d_2$ can be either positive, negative, zero, or a combination thereof to obtain desired device design. The substrate 1410 and one or more layers 1412 (e.g., active region) between the substrate 1410 and graded region 1402 are also shown.

In the epitaxial structures shown in FIGS. 2(a)-2(d) and FIGS. 12(a)-12(d), the doping, composition, and thickness of the layers can be modified/designed to achieve desirable device characteristics. In these structures, a tunnel junction is formed between the graded region and an n type region which may or may not be graded itself. Current flow across the junction occurs from the conduction band of the n region to the valence band of the graded region. The separate p-type regions shown may or may not be active regions.

FIGS. 15(a)-15(d) and 16(a)-16(d) illustrate another embodiment of the present invention. In the epitaxial stack 1500, 1600 a p-type doped layer 1502, 1602 is replaced by one or multiple graded (Ga,Al,In,B)N layers 1504, 1604 followed by the rest of desired epitaxial structure 1506, 1606 resulting in buried graded (Ga,Al,In,B)N layers 1504, 1604. Thereafter, the layers 1506 (e.g., n-type doped layer 1606) deposited/grown above graded (Ga,Al,In,B)N layers 1504, 1604 are selectively removed/etched from a part of (or completely from) the wafer 1500, 1600 to form an etched region 1508, 1608. Subsequently, in the etched region 1508, metal 1510 is deposited which may have a distance of $d_1$ and $d_2$ from two adjacent layers 1506. The value of $d_1$ and $d_2$ can be either positive, negative, zero, or a combination thereof, to obtain desired device design (15(a)-15(d) and 16(a)-16(d)). In the epitaxial structures shown in FIGS. 15(a)-15(d) and 16(a)-16(d), the doping, composition, and thickness of the layers can be modified/designed to achieve desirable device characteristics. In these structures, a tunnel junction is formed between the graded region and an n type region which may or may not be graded itself. Current flow across the junction occurs from the conduction band of the n region to the valence band of the graded region. The separate metal regions shown may or may not be active regions. The substrate 1512/1612 and one or more layers 1514/1614 (e.g., active region including electron blocking layer EBL) between the substrate 1512/1612 and graded region 1504/1604 are also shown.

FIGS. 17(a)-17(d) illustrate another embodiment of the present invention. In the epitaxial stack 1700 in FIGS. 17(a)-17(d), a p-type doped layer 1702 is replaced by one or multiple graded (Ga,Al,In,B)N layers 1704 followed by the rest 1706 of desired epitaxial structure resulting in buried graded (Ga,Al,In,B)N layers 1704. Thereafter, the layers 1706 deposited/grown above graded (Ga,Al,In,B)N layers 1704 are selectively removed/etched from a part of (or completely from) the wafer 1700. Subsequently, in the etched region, doped p-type material 1708 (which may or may not be III-N) is regrown and activated (if needed). The active p-type doped layer 1708 provides holes to the buried graded (Ga,Al,In,B)N layers resulting in graded (Ga,Al,In,B)N to act as active p-GaN layer throughout entire wafer. FIG. 17(b) shows the regrown p-type layer 1708 is grown in such a way that the regrown p-type region 1708 makes at least one contact to each graded (Ga,Al,In,B)N layer 1704 in one active region 1710. In the epitaxial structure 1700 shown in FIGS. 17(a)-17(d), doping, composition and thickness of the layers can be modified/designed to achieve desirable device characteristics. In this structure, multiple tunnel junctions are formed between the graded region 1704 and an n type region 1706 which may or may not be graded itself. Current flow across the junction occurs from the conduction band of the n region to the valence band of the graded region. The separate p-type region 1708 shown in FIG. 17(b) may or may not be an active region. The substrate 1712 and one or more layers 1714 between the substrate 1712 and graded region 1704 are also shown. Layers 1 . . . k comprise k one or more layers 1804,1806 where k is an integer.

FIGS. 18(a)-18(d) illustrate an epitaxial stack 1800, wherein a p-type doped layer 1802 is replaced by one or multiple graded (Ga,Al,In,B)N layers 1804 followed by the rest 1806 of desired epitaxial structure resulting in buried graded (Ga,Al,In,B)N layers 1804. Thereafter, the layers 1806 deposited/grown above graded (Ga,Al,In,B)N layers 1804 are selectively removed/etched from a part of (or completely from) the wafer 1800. Subsequently, in the etched region, metal 1808 is deposited. FIGS. 18(*a*)-18(*d*) shows the metal 1808 is deposited in such a way that the deposited metal 1808 makes at least one contact to each graded (Ga,Al,In,B)N layer 1804 in one active region 1810. The substrate 1812 and one or more layers 1814 between the substrate 1812 and graded region 1804 are also shown.

FIGS. 19(*a*)-19(*d*) illustrate another embodiment of the invention, wherein the p-type doped layer 1900 is replaced with graded materials 1902, 1904 having multiple graded junctions with different grading profiles to provide varying hole concentrations related to the nature of the grading profile.

In one particular embodiment a sharply graded layer 1902 is incorporated adjacent to the surface 1906 to enable tunneling of holes from the metals 1908 into the graded regions 1902, 1904 directly without the need of a p-type doped region 1900. This can be an acceptor free structure with holes, which is a new invention with multiple opportunities.

In another embodiment of the present invention, the regrown p-type region as shown in FIGS. 2(*a*)-2(*d*) and FIGS. 12(*a*)-12(*d*) may be used as an active LED region.

Process Steps

Figure 20:
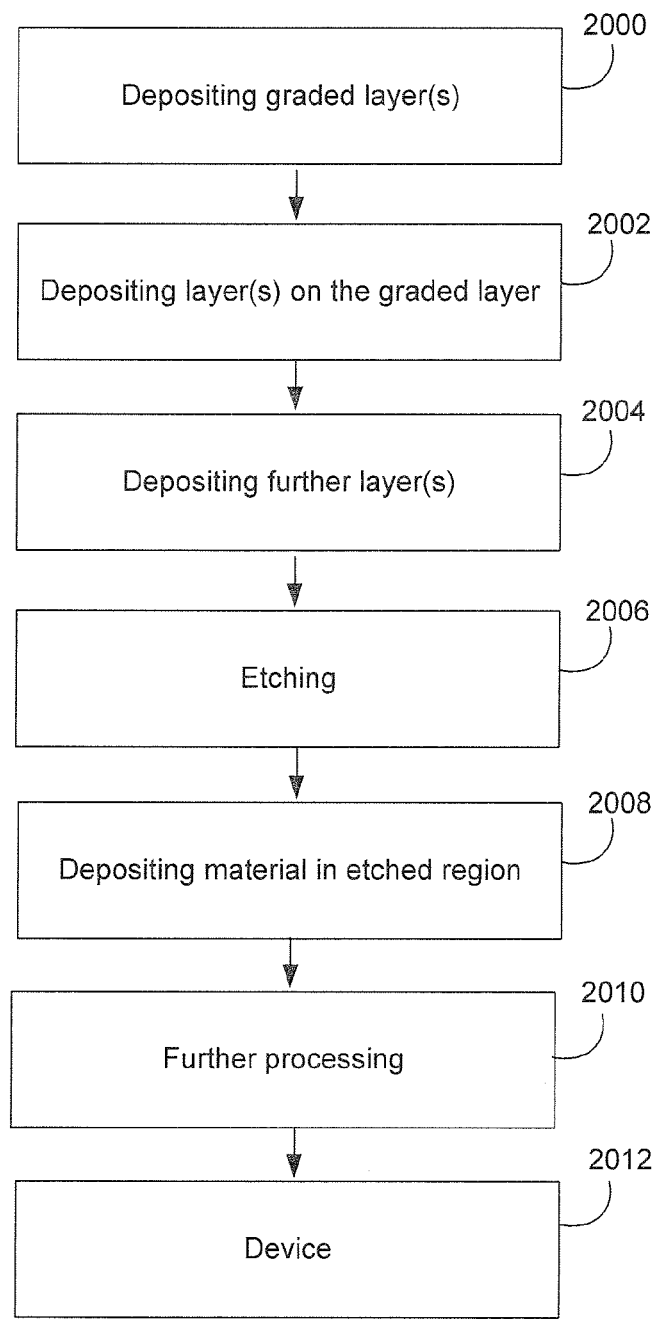
FIG. 20 is a flowchart illustrating a method of fabricating a device according to one or more embodiments of the present invention.

FIG. 20 is a flowchart illustrating a method of fabricating a device according to one or more embodiments of the present invention. The method comprises one or more of the following steps.

Block 2000 represents depositing a polar p region (e.g., polar p-type region) comprising a graded layer 1102, 1204, 1302, 1402, 1504, 1604, 1704, 1804 (having a polar orientation) and/or an abrupt interface or multiple interfaces between layers with a polarization discontinuity. In one embodiment, the step comprises depositing an active region comprising the polar p region, the polar p region comprising the graded layer or graded polar materials 104, 204, 304, 404, 502, 602, 700, 706, 804 (having a polar orientation) or the polar p region comprising an abrupt interface or multiple interfaces between layers with a polarization discontinuity.

In one or more embodiments, the polar p region is deposited on or above a substrate or base layer.

In one or more embodiments, the polar orientation is a c-plane (e.g., N-polar or Ga polar orientation) and the graded layer/graded polar materials are III-nitride layers grown on a III-nitride substrate such as Gallium Nitride (GaN) 800. Ga-polar refers to layers having a c⁺ or (0001) plane orientation, and N-polar refers to layers having a c⁻ or (000-1) plane orientation. Other examples of substrates 108 include, but are not limited to, foreign substrates such as sapphire. In one example, the base layer comprises GaN on sapphire.

The graded layer can be grown on part of a device structure (e.g., active region and electron blocking layer) grown on the substrate.

Block 2002 represents depositing one or more layers 206, 406, 1206, 1404, 1506, 1706, 1806, 1902, 1904 on, above, or below the polar p region (e.g., the graded layer 1102, 1204, 1302, 1402, 1504, 1604, 1704, 1804) and/or the active region comprising the polar p region (e.g., the graded polar materials/layer 104, 204, 304, 404, 502, 602, 700, 804).

In one or more embodiments, the one or more layers comprise a hole supply region. In one or more embodiments, the hole supplying region comprises or consists essentially of a p-type doped region 210, 306, 406, 410, 504, 606, 1208, 1400, 1300, 1708 such as a III-nitride region (e.g., p-type GaN). In yet further embodiments, the hole supplying region comprises/consists essentially of metal 704, 1510, 1600, 1808 such as, but not limited to, gold (Au), silver (Ag), titanium (Ti), nickel (Ni), palladium (Pd), platinum (Pt), etc or combinations thereof. In other embodiments, one or more embodiments, the hole supplying region comprises a metal region and/or a p-type doped region.

In one embodiment wherein the hole supplying region comprises a metal, the active region or graded III-nitride layer comprises a steep or sharp composition grade 700, 904, 1806, 1902, adjacent the metal 704, Ni/Au, Pd/Au, 1908 wherein the steep or sharp composition grade enables tunneling of holes from the metal into the active region or the graded III-nitride layer. Examples of the sharp grade include, but are not limited to, an InGaN region having an indium composition graded from 5%-25% over a thickness of 5 nanometers or less. In one or more examples, the sharp grade creates a negative charge concentration of at least $8.1 \times 10^{19}$ cm$^{-3}$. In yet further embodiments, the graded III-nitride layer comprises a layer underneath the sharp grade and the layer underneath the sharp grade has an indium composition graded from 0% to 5% over a thickness of at least 100 nm.

In one or more embodiments, the one or more layers on the graded III-nitride layer are n-type layers 1206 (e.g., n-type III-nitride such as, but not limited to, n-type GaN).

Block 2004 represents optionally depositing one or more further layers 308, 408 on the hole supplying region 306, 406.

Block 2006 represents optionally at least partially etching the layers (formed in Blocks 2002 and 2004 on the graded III-nitride layer) to form an etched region 310, 1508, 1608.

Block 2008 represents optionally depositing/growing material 210, 410, 606, 1208, in the etched region and on the graded III-nitride layer.

In one embodiment where the hole supply region 306 406 is deposited in Block 2002, the material deposited in the etched region comprises a p-type region 410 (e.g., p-type GaN).

In one embodiment where an n-type layer 1206, 1606 is deposited in Block 2002, the material 210, 1208, 1600 deposited in the etched region comprises a hole supplying region as described above. In one or more embodiments, a tunnel junction is formed between the graded III-nitride layer 1204, 1604 and the n-type region/layer 1206, 1606. In one or more embodiments, the hole supplying region comprises a component of a tunnel junction.

Block 2010 represents optional further processing steps, including, but not limited to, formation of contacts.

Block 2012 represents the end result, a device or device structure comprising an active region 902, 104, 204, 304, 404, 502, 602, 700, 706, 804 (comprising graded polar materials) and/or graded region (e.g., graded III-nitride region/layer) 1102, 1204, 1302, 1402, 1504, 1604, 1704, 1804, wherein the active region or the graded region is on or above a polar substrate; and a hole supply region 210, 306, 406, 410, 504, 606, 1208, 1400, 1300, 1708, 704, 1510, 1600, 1808 on or above the active region 902 and/or the graded layer. Holes in the hole supply region are driven by a field into the active region 902 and/or the graded layer 1102, 1204, 1302, 1402, 1504, 1604, 1704, 1804, 104, 204, 304, 404, 502, 602, 700, 706, 804 and the field arises at least in part due to a piezoelectric and/or spontaneous polarization field generated by the polar p region (e.g., the piezoelectric and/or spontaneous polarization field generated by a composition and grading of the polar p region including the graded layer/graded polar materials). The holes driven into the active region may (for example) form a hole gas in the active region.

The methods described herein allow the formation of a hole supplying region and active region having various properties and various locations throughout the device. For example, the device:
- may be fabricated without providing acceptor dopants in the device structure and/or in active region, or so that the active region and/or the device structure does not contain a p-type dopant; and/or
- may comprise the active region buried within the device structure; and/or
- may comprise the hole supply region buried or on a surface of the device; and/or
- may comprise the hole supply region including a p-type region that is etched or selectively regrown so that it does not completely cover the active region.

In various examples, a thickness and doping of the hole supply region, and composition and grading of the active region, are selected:
- such that the field creates a negative charge of at least $10^9$ $cm^{-3}$ (e.g., $8 \times 10^{19}$ $cm^{-3}$) in the active region; and/or
- such that the field creates a hole density of at least $10^{19}$ $cm^{-3}$ in the active region; and/or
- To obtain a desired hole concentration in the active region; and/or
- to obtain a diode comprising the device structure has a turn on voltage of no more than 5.0 Volts; and/or
- such that the holes neutralize the negative charge created by the field.

In various examples, the one or more layers, the hole supply region, and the graded III-nitride layer are grown by Metalorganic Chemical Vapor Phase Deposition (MOCVD), so that the tunnel junction/tunneling part of the structure is formed without Molecular Beam Epitaxy. The p-type region of the device (including the hole supplying region) can be activated at various stages during the fabrication process (e.g., activating the p-type region in the etched region)

Device Structure Examples

Examples of devices enabled by one or more embodiments of the present invention include LEDs without acceptor doping in the active p-type region (p-region), buried active p-regions and devices based on this availability, such as tunnel junction based LEDs and lasers, and vertical electronic devices that need buried p-regions, such as Current Aperture Vertical Electron Transistors (CAVETs), Trench Metal Oxide Semiconductor Field Effect Transistors (MOSFETs), and super-junction devices.

Embodiments of the present invention could be used to replace the p-type layers/regions in the structures described in U.S. Provisional Patent Application No. 62/250,741 (UC Ref 2016-249-1), U.S. patent application Ser. No. 15/344,377, and PCT international application No. PCT/US15/31041 (UC Ref 2014-718-2) cross-referenced above.

In one or more transistor embodiments, the graded III-nitride layer is the active region or (e.g., gated) channel layer (e.g., comprising the hole gas), or the graded III-nitride layer is part of the tunnel junction forming an electrical contact (e.g., tunnel junction contact) to the transistor, or the graded III-nitride layer is the current blocking layer in the transistor. Examples of transistors include field effect transistors, vertical electronic devices, such as, but not limited to, CAVETs, Trench Metal Oxide Semiconductor Field Effect Transistors, and super-junction devices such as CoolMOS Si devices. Such transistors may be useful in power electronics applications.

In one or more light emitting device embodiments, such as an LED or laser diode, the graded III-nitride layer is an active region of the device or part of the tunnel junction forming an electrical contact to the device. The holes driven into the active region recombine with electrons in the active region to emit the light emitted by the light emitting device.

Flip Chip Device

Figure 21:
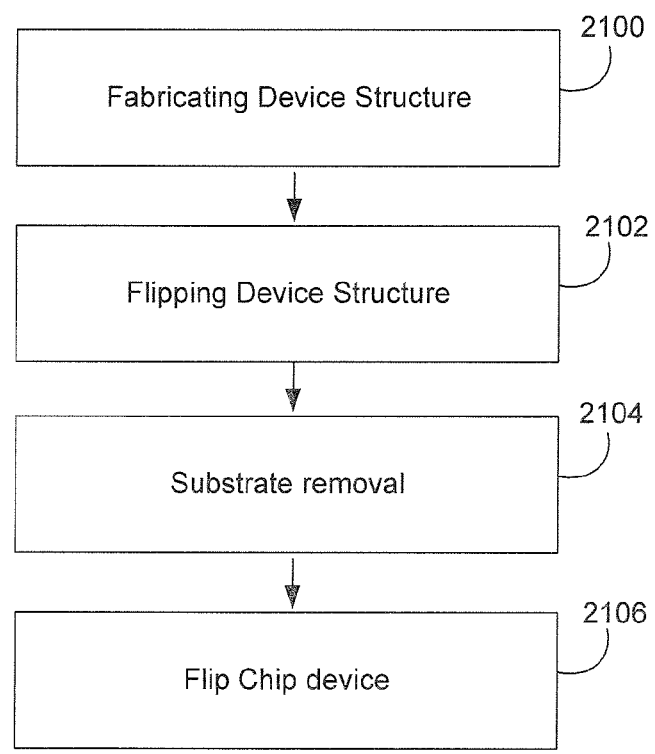
FIG. 21 is a flowchart illustrating a method of fabricating a device according to one or more embodiments of the present invention.

FIG. 21 is a flowchart illustrating a method of fabricating a light emitting diode.

Block 2100 represents fabricating a device structure including an active region on a substrate. The active region comprises a polar p region, wherein the polar p region includes graded polar materials (having a polar orientation) and/or an abrupt interface or multiple interfaces between layers with a polarization discontinuity. The device structure further comprises a hole supply region, wherein holes in the hole supply region are driven by a field into the active region, the field arising at least in part due to a piezoelectric and/or spontaneous polarization field generated by the polar p region (e.g., by a composition and grading of the active region). In one example, the hole supply region comprises a p-GaN layer and the active region between the p-GaN layer and an n-type GaN layer.

Block 2102 represents flipping the device structure and mounting the side of the device structure opposite the substrate onto a submount.

Block 2104 represents the optional step of removing the substrate.

Block 2106 represents the end result, an inverted or flip-chip light emitting diode wherein the hole supply region (e.g., the p-GaN layer) is buried beneath a surface of the light emitting diode (i.e. the hole supply region or the p-GaN layer is not at a surface of the device).

Further Experimental Results

Table 1 lists the samples used to investigate the properties of the polarization-induced 3DHG.

TABLE I

Sample list and hole concentration at 100 K and 300 K.

| Sample No. | Group | Un-coped graded $In_xGa_{1-x}N$ layer | | Mg doped $In_xGa_{1-x}N$ cap layer | | Hole concentration($cm^{-2}$) from hall measurements | |
|---|---|---|---|---|---|---|---|
| | | Thickness | In composition | Thickness | In composition | 100 K | 300 K |
| 1 | Hall-series A | 100 nm | 0%→5% | 40 nm | 5% | $6.58 \times 10^{17}$ | $5.09 \times 10^6$ |
| 2 | | 100 nm | 0%→10% | 40 nm | 10% | $1.58 \times 10^{18}$ | $5.56 \times 10^8$ |
| 3 | | 100 nm | 0%→20% | 40 nm | 20% | $3.91 \times 10^{18}$ | $7.20 \times 10^6$ |
| 4 | Hall-series B | 100 nm | 0%→5% | 40 nm | 5% | $6.58 \times 10^{17}$ | $5.09 \times 10^8$ |
| 5 | | 300 nm | 0%→5% | 40 nm | 5% | $2.12 \times 10^{19}$ | $4.43 \times 10^6$ |

All samples were grown on n-type bulk GaN (0001) substrates by metal organic chemical vapor deposition (MOCVD) at atmospheric pressure. The average dislocation density of the bulk GaN substrates was $10^6$ cm$^{-2}$. Trimethylgallium (TMGa), triethylgallium (TEGa), trimethylindium (TMIn), ammonia (NH$_3$) and bis-cyclopentadienyl-magnesium (Cp$_2$Mg) were used as precursors for Ga, In, N and Mg, respectively. For samples 1 to 6, first, a 3 μm-thick semi-insulating layer (resistance ~10$^7$Ω) was grown at 1200° C. in hydrogen (H$_2$) carrier gas to prevent the current flow into the bottom conductive layer, bulk GaN substrate, during hall measurements. Thereafter, an un-doped graded In$_x$Ga$_{1-x}$N layer was grown in nitrogen (N$_2$) carrier gas. In this study, the InN mole fraction (Hall-series A) and the thickness in compositionally graded In$_x$Ga$_{1-x}$N layers (Hall-series B) were varied. For Hall-series A, the indium composition was changed from 0% to 5%, 10%, and 20% by growing at 855° C., 870° C., and 890° C. respectively (samples numbered 1, 2 and 3 in Table 1). The TMIn molar flow rate was increased from 0 mol/min to 4.19×10$^{-6}$ mol/min, while the TEGa flow rate was kept constant at 6.03×10$^{-6}$ mol/min. The thickness of the graded In$_x$Ga$_{1-x}$N layer was 100 nm. Here, the average composition of the graded In$_x$Ga$_{1-x}$N layers is lower than the Mg-doped In$_x$Ga$_{1-x}$N films used in previous studies [19]. This was done to ease the growth process by limiting overall epi-layer strain. For Hall-series B, the thickness of the compositionally graded In$_x$Ga$_{1-x}$N layer thickness was varied from 100 nm to 800 nm, while the maximum indium composition was kept constant at 5%. For all samples, the samples were capped with a 40 nm-thick Mg-doped In$_{0.05}$Ga$_{0.95}$N contact layer. The room temperature hole concentration and hole mobility of this contact layer was 4.2×10$^{18}$ cm$^{-3}$ and 11.1 cm$^2$/Vs, respectively. For Hall-series A, the Cp$_2$Mg flow rate was adjusted according to the indium concentration in the top contact layer to generate the same hole concentration in the contact layer for all samples [19]. For comparison, a reference sample with a 100 nm-thick Mg-doped In$_{0.05}$Ga$_{0.95}$N layer was grown. All samples were annealed at 700° C. in an N$_2$/O$_2$ ambient to activate the top Mg doped contact layer. The device fabrication process started with the deposition of Ni/Au electrodes as ohmic contacts. Thereafter, lithographic patterning and reactive ion etching (RIE) using BCl$_3$/Cl$_2$ gases were carried out for mesa isolation in order to specify the device area. The indium composition of the compositionally graded In$_x$Ga$_{1-x}$N layer was evaluated by x-ray diffraction measurements. Van der Pauw-Hall effect measurements using a helium closed-cycle refrigerator system were carried out from 50K to 300K to examine the electrical properties of the un-doped compositionally graded In$_x$Ga$_{1-x}$N layers. We confirmed good ohmic contact characteristics and all samples exhibited p-type conductivity. In addition to Hall measurements, capacitance-voltage (C-V) measurements were performed on sample number 8 to demonstrate the presence of 3DHG within a compositionally graded In$_x$Ga$_{1-x}$N layer. For this sample, first, a 2 μm-thick n$^+$-GaN layer and a 100 nm-thick un-doped GaN layer were grown. The carrier concentrations in the n$^+$-GaN layer and un-doped GaN layer were 5×10$^{18}$ cm$^{-3}$ and 2×10$^{15}$ cm$^{-3}$, respectively. Thereafter, a 600 nm-thick un-doped graded In$_x$Ga$_{1-x}$N layer was grown where the InN mole fraction was increased from 0% to 5%, followed by a 30 nm-thick In$_{0.05}$Ga$_{0.95}$N:Mg (Mg: 8×10$^{19}$ cm$^{-3}$) contact layer. In this structure, the un-doped GaN layer was added to ensure the crystal quality and surface morphology of the subsequent graded In$_x$Ga$_{1-x}$N layer. After activating the sample in N$_2$/O$_2$ ambient, Ni/Au and Ti/Au were deposited by electron-beam evaporation on the top surface and the back surface, respectively. Mesa isolation was done using reactive ion etching (RIE). C-V measurements were carried out at a frequency of 1 MHz and at an ac modulation level of 0.1 V.

FIGS. 22(a), 22(c), and 22(e) show the triple axis x-ray ω-2θ scans and AFM images of samples 1, 2, and 4. For all samples, the experimental data matches well with the simulated curves FIGS. 22(a), 22(c), and 22(e), confirming the growth of compositionally graded In$_x$Ga$_{1-x}$N layers. Atomically flat surfaces with steps and without any V-defects were observed for all samples owing to the use of low dislocation bulk GaN substrates [20-21] as shown in FIGS. 22(b), 22(d), and 22(f). The measured root-mean-square roughness values were 0.76 nm, 0.98 nm and 1.17 nm for sample 1, 2 and 4 respectively.

Figure 23A:
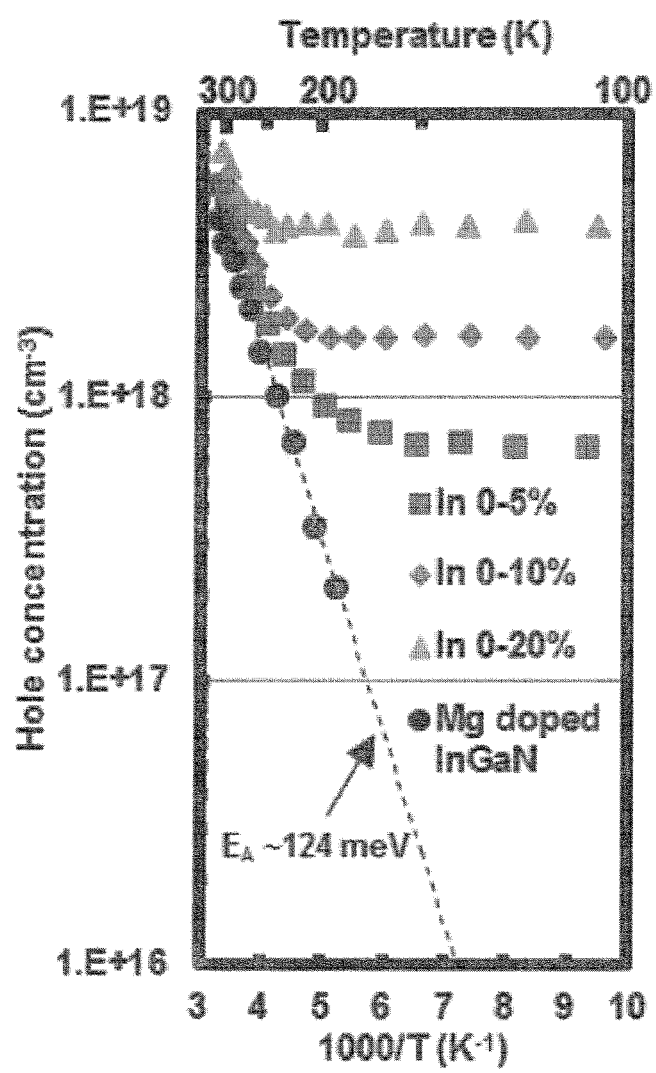
FIGS. 23(a)-23(c) show temperature-dependent Hall effect measurements (100K-300K) on 100 nm-thick un-doped, compositionally graded In$_x$Ga$_{1-x}$N layers with different gradations of the InN mole fraction (0-5%, 10%, 20%) and Mg doped $In_{0.05}Ga_{0.95}N$ layer: (a) hole concentration, (b) resistivity, and (c) hole mobility.
Figure 23B:
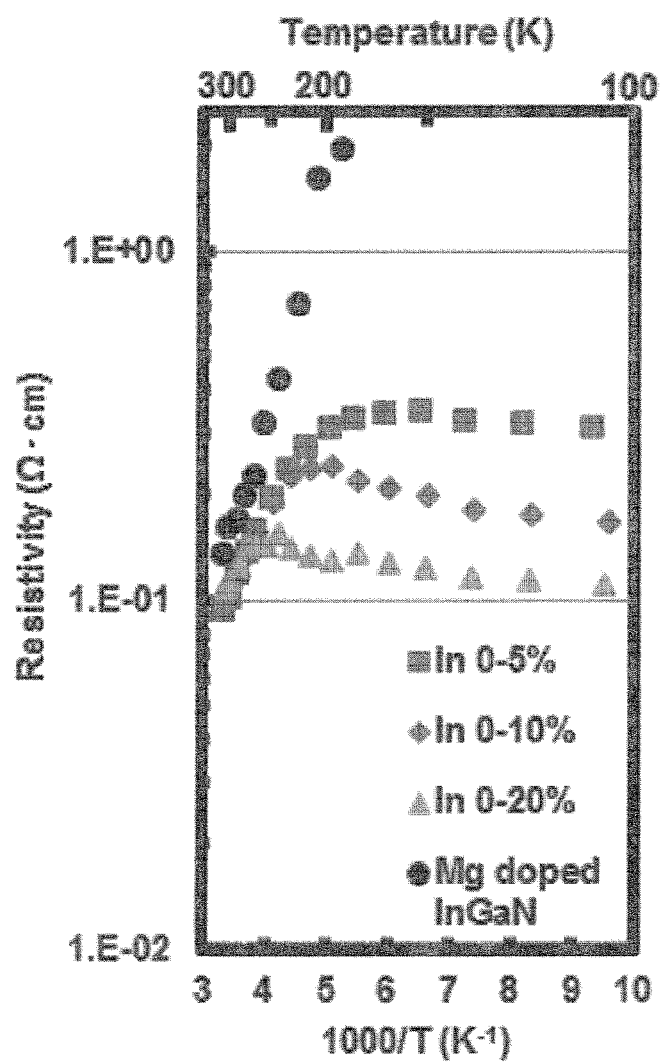
Figure 23C:
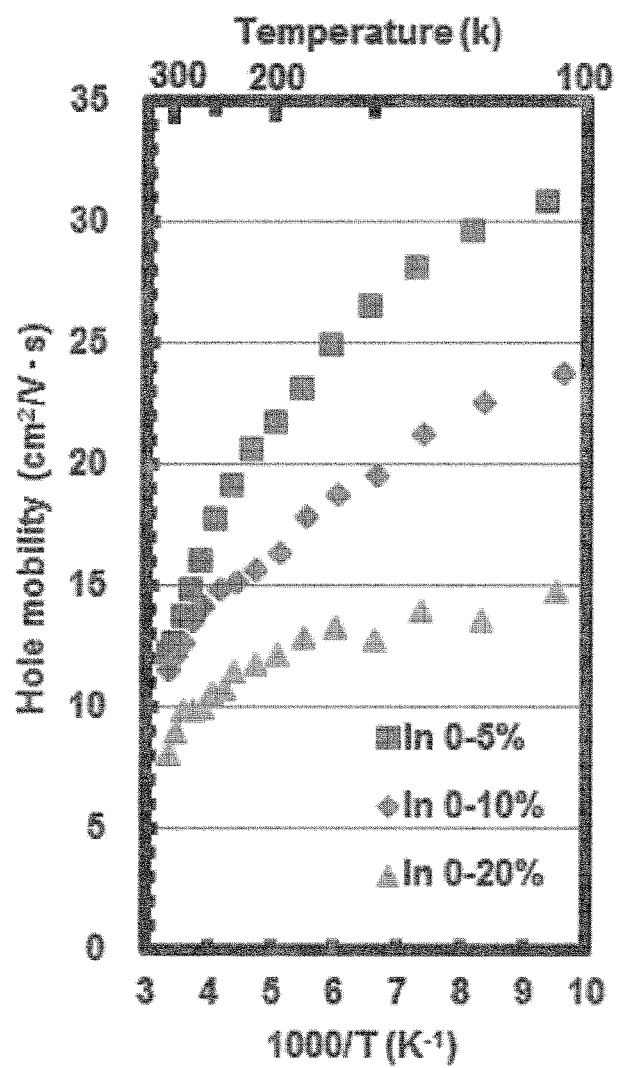

FIGS. 23(a)-23(c) display the results of the temperature dependent Hall-effect measurements for sample 1, 2, 3 and 7. The following procedure was used to calculate the hole concentration: (1) The measured sheet carrier density, p1 (cm$^2$), was the sum value of sheet carrier density of graded In$_x$Ga$_{1-x}$N layer and Mg-doped InGaN contact layer. From p1, the sheet carrier density of Mg-doped InGaN contact layer, p2, was subtracted in order to obtain the net sheet carrier density of the graded In$_x$Ga$_{1-x}$N layer, p3=p1−p2. p2 was acquired using reference samples that having constant composition Mg-doped In$_x$Ga$_{1-x}$N layers (sample 7). (2) Then, p3 was divided by the graded InGaN layer thickness, d$_{graded\ InGaN}$, to calculate the carrier density in graded InGaN layer, P$_{graded\ InGaN}$(cm$^{-3}$)=p3/d$_{graded\ InGaN}$. (3) Thereafter, P$_{graded\ InGaN}$ added to the carrier concentration of Mg-doped InGaN contact layer, P$_{contact\ InGaN}$=p2/d$_{contact\ InGaN}$. The sum value of P$_{graded\ InGaN}$ and P$_{contact\ InGaN}$ at each measured temperature was plotted in FIG. 23(a). While the hole concentration of the reference sample with constant indium composition and Mg doping decreases exponentially with decreasing temperature due to carrier freeze-out [10] (black circles in FIG. 23(a)), all compositionally graded In$_x$Ga$_{1-x}$N samples exhibited a temperature independent hole concentration at less than ~200K, thus confirming the presence of a 3-DHG. Note that these hall measurement results are total value of hole concentration in a Mg-doped In$_x$Ga$_{1-x}$N cap layer and a graded In$_x$Ga$_{1-x}$N layer. As a result, the similar temperature dependent behavior is observed from RT to ~200K for Hall series A samples and the reference sample. To evaluate the gradation effect of InN mole fraction of the polarization doping on carrier concentration, the hole concentration at 100K was compared between samples graded to 5, 10, and 20% InN. Here, at 100K, the hole concentration would only comprise of holes from graded layer as the Mg doped contact layer suffers from carrier freeze-out.

FIG. 23(a) shows that increasing the steepness of the grade, and thereby, increasing the rate of change of polarization charge across the graded layer, results in an increased hole concentration from 7.1×10$^{17}$ cm$^{-3}$ to 3.9×10$^{18}$ cm$^{-3}$. Even higher hole concentration may be achievable in N-polar compositionally graded In$_x$Ga$_{1-x}$N layers because of the higher indium incorporation efficiency in N-compared to Ga-polar films at the same TMIn flow rate [17]. The measured resistivities also show the different temperature dependent behavior of the un-doped compositionally graded In$_x$Ga$_{1-x}$N samples compared to the reference sample with constant composition In$_{0.05}$Ga$_{0.95}$N:Mg. Even though the layer resistivities at room temperature are almost identical (FIG. 23(b)), the resistivity of the reference sample increases monotonically with decreasing temperature from 0.14 Ω·cm to 1.94 Ω·cm. The different behavior was observed in the graded samples, where the resistivity initially increased as the temperature decreased, but then began to decrease at around 200-250K. The increase of resistivity at the range of 250-300 K could be the impact of Mg-doped $In_xGa_{1-x}N$ contact layer. The decrease of resistivity at less than 250K indicates that there are holes induced by the polarization field in the graded $In_xGa_{1-x}N$ layer. FIG. 2(c) shows the hole mobilities at different temperatures for the graded $In_xGa_{1-x}N$ samples. The increase in the hole mobility with decreasing indium composition could be attributed to the influence of alloy scattering [11].

Figure 24A:
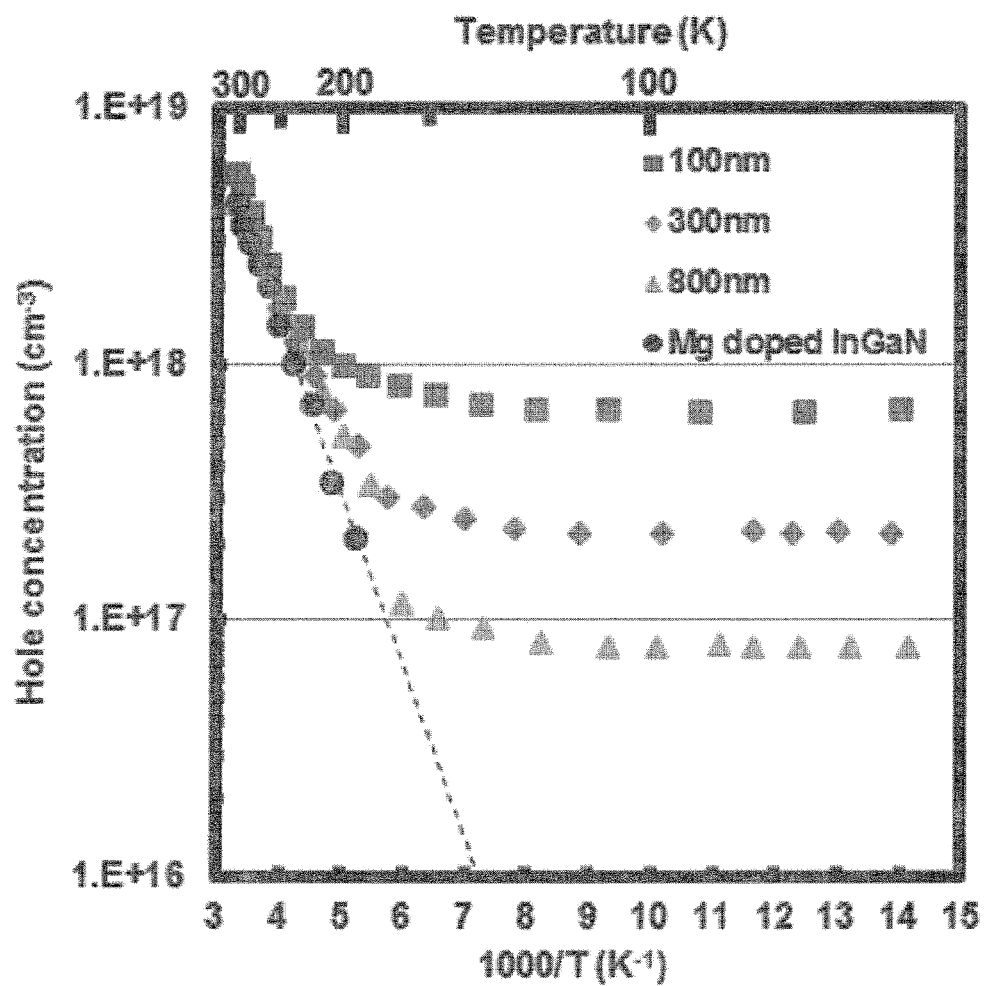
FIGS. 24(a)-24(b) show temperature-dependent Hall effect measurement results (50K-300K) for three un-doped, compositionally graded $In_xGa_{1-x}N$ layers (x:0→0.05) with different thicknesses (100, 300, 800 nm) and Mg doped $In_{0.05}Ga_{0.95}N$ layer: (a) hole concentration and (b) hole mobility.
Figure 24B:
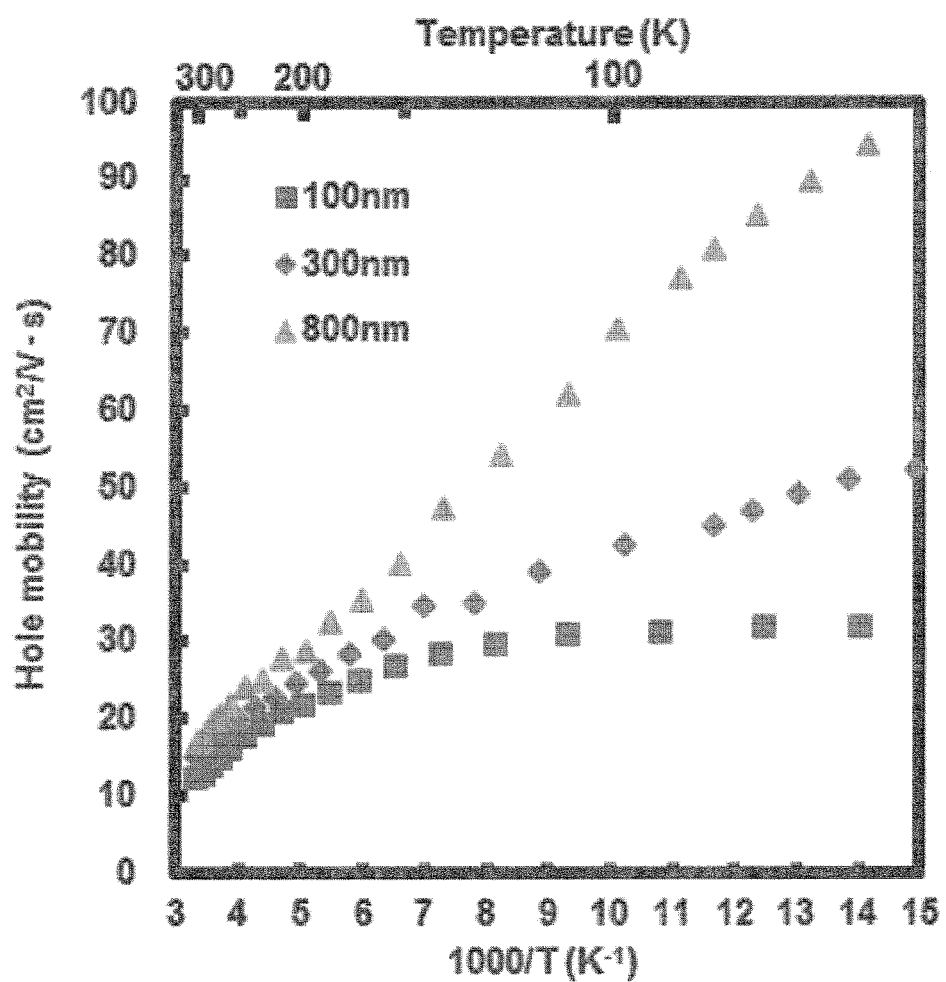

FIGS. 24(a)-24(b) display the results of the temperature dependent Hall-effect measurements for series B. The hole concentration in all graded $In_xGa_{1-x}N$ samples was independent of the measurement temperature over a wide temperature range. The saturation hole concentration value at less than 150K was approximately inversely proportional to the thickness of the graded $In_xGa_{1-x}N$ layer (FIG. 24(a)). The hole mobility increased with increasing thickness of the graded $In_xGa_{1-x}N$ layer (FIG. 24(b)), an effect that was much more pronounced at low temperature. The temperature dependence of the hole mobility might be caused by alloy and phonon scattering. Further investigations are needed to clarify the contributions of the different scattering mechanisms.

Figure 25A:
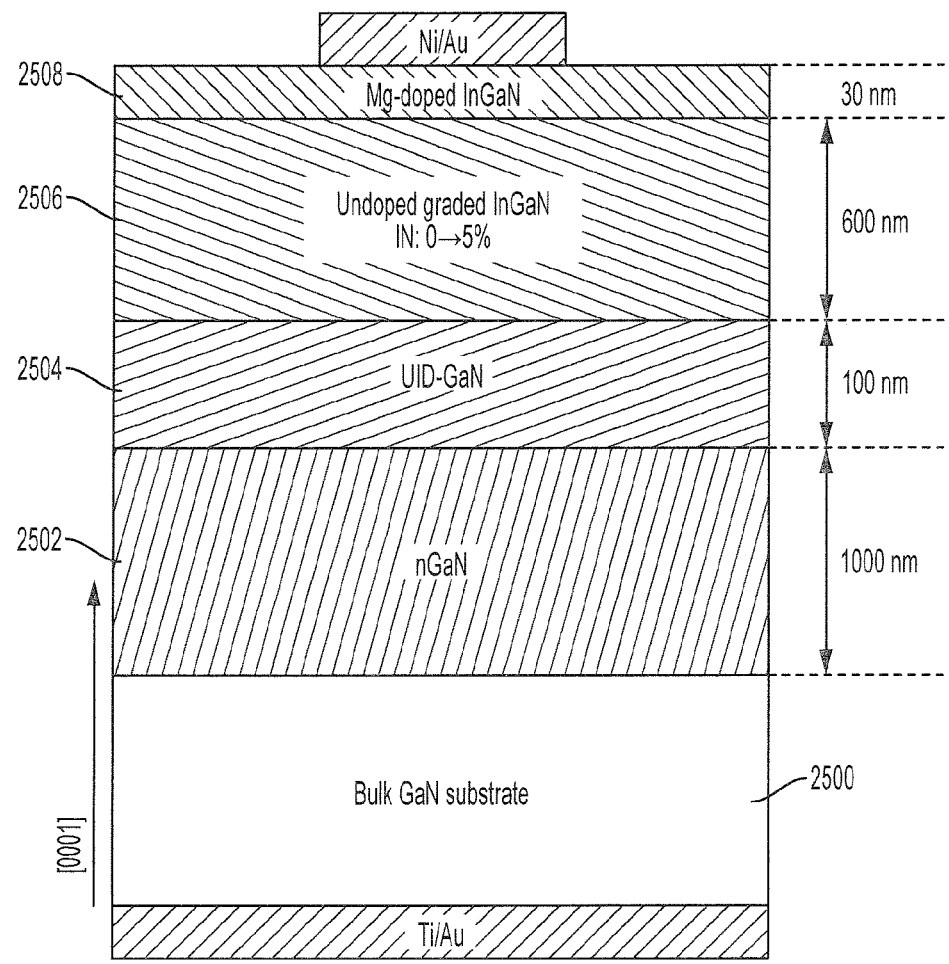
FIG. 25(a) is a schematic p-n diode structure of sample number 8 and FIG. 25(b) shows the $1/C^2$ and depletion width as a function of voltage for the p-n diode with 600 nm thick compositionally graded $In_xGa_{1-x}N$ layer (x:0→0.05). The solid line corresponds to $1/C^2$, the dotted line is the depletion width. The carrier concentration of the compositionally graded $In_xGa_{1-x}N$ layer was extracted from the dashed line.
Figure 25B:
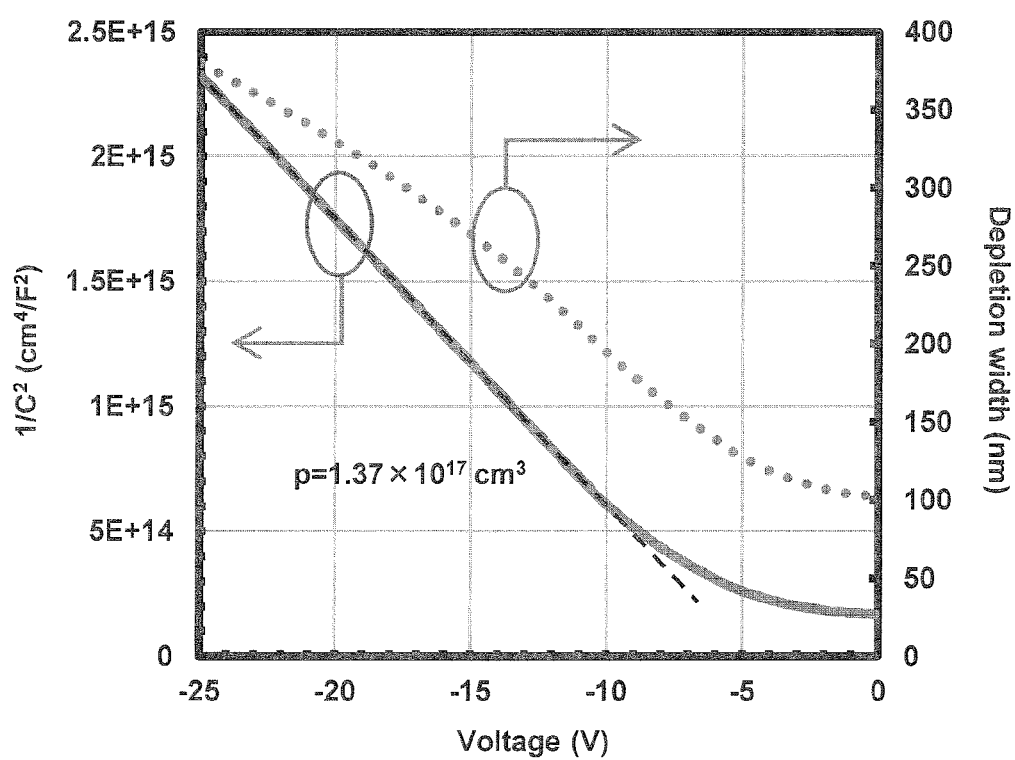

FIG. 25(a) shows p-n diode structure and the $1/C^2$ and depletion width as a function of voltage measured for sample 8. The carrier concentration extracted from the raw C-V measurements, $1.37 \times 10^{17}$ cm$^{-3}$, was similar to the value expected from the Hall measurements. The results confirmed that the 3DHG was confined within the graded layer region. The inventors believe that the non-linear region (between 0V to −10V) in the C-V characteristics is due to the initial non-uniform incorporation of Indium in the graded layer. The structure comprises a bulk GaN substrate 2500, n-type GaN (n-GaN) 2502 (e.g., 1000 nm thick) on the substrate 2500, unintentionally doped (UID) GaN 2504 (e.g., 100 nm thick) on the n-GaN 2502, undoped graded InGaN 2506 with Indium (In) composition graded from 0 to 5% over a thickness (of e.g., 600 nm) on the UID-GaN 2504, magnesium (Mg) doped InGaN 2508 (e.g., 30 nm thick) on the graded InGaN 2506 (e.g., 30 nm thick), Ni/Au contacts on the Mg doped InGaN 2508, and Ti/Au contacts on the substrate 2500.

Thus, the existence of a 3DHG in un-doped and compositionally graded $In_xGa_{1-x}N$ layers on Ga-polar GaN has been experimentally confirmed. The temperature dependent hall measurement results showed the saturation behavior of hole concentration in the un-doped compositionally graded $In_xGa_{1-x}N$ layers at less than −200K. The 3DHG density was controlled by varying the indium composition and/or thickness of the graded $In_xGa_{1-x}N$ layer. The hole concentration in a 100 nm-thick un-doped, graded $In_xGa_{1-x}N$ layer where the indium composition was graded from x=0 to x=0.2 was as high as $3.9 \times 10^{18}$ cm$^{-3}$ at 100K. The results of this study suggest that polarization-induced doping is an attractive way to enhance the hole concentration in group III-nitride heterostructures and can contribute towards improving the performance of the next generation of GaN-based devices.

Possible Modifications and Variations

In one or more embodiments the polar orientation is a c-plane (e.g., N-polar or Ga polar orientation) and the device layers are III-nitride layers on a III-nitride substrate such as Gallium Nitride (GaN). Ga-polar refers to layers having a e or (0001) plane orientation, and N-polar refers to layers having a c$^-$ or (000-1) plane orientation.

However, the methods/devices of the present invention are not limited to III-nitride materials. For example, graded polar materials can also be used. Such graded polar materials can comprise, but are not limited to, binary, ternary, and quaternary compounds combining group III elements of the periodic table (Al, Ga, In, B) with group V elements of the periodic table (N, P, As, Sb, Bi) to form III-V materials such as (Al, Ga, In, B) (N, P, As, Sb, Bi).

The layers and structures described herein can be grown using growth techniques, including (but not limited to) metal-organic chemical vapor deposition and molecular beam epitaxy.

A thickness and doping of the hole supply region, and composition and grading of the active region, can be selected such that the field creates a negative charge of at least $8 \times 10^{19}$ cm$^{-3}$ in the active region, such that the field creates a hole density of at least $10^{19}$ cm$^{-3}$ in the active region, to obtain a desired hole concentration in the active region, such that a diode comprising the device structure has a turn on voltage of no more than 5.0 Volts, and/or such that the holes neutralize at least 90% of the negative charge created by the field.

The device can be fabricated without providing acceptor dopants in the active region, or such that the active region does not contain a p-type dopant.

The device can be an inverted LED with the p-GaN layer not at the surface. For example, the device can comprise an inverted or flip-chip light emitting diode and the hole supply region can be a p-GaN layer buried beneath a surface of the light emitting diode. For example, the p-GaN layer can be between the active region and a substrate, submount, or sacrificial substrate, and the active region can be between the p-GaN layer and an n-type GaN layer.

Advantages and Benefits

The devices enabled by one or more embodiments of the invention include LEDs without acceptor doping in the active p-region, buried active p-regions and devices based on this availability, such as tunnel junction based LEDs and lasers, and vertical electronic devices that need buried p-regions such as CAVETs, Trench MOSFETs, and superjunction devices such as CoolMOS Si devices. In addition, since there is no need for growth of high quality p-regions, the temperature of the device stack could be reduced which is desirable for devices that prefer a low thermal budget such as green lasers. In addition, the method allows p-type doping of materials where traditional doping is hampered by a very high acceptor activation energy, as for example in aluminum and boron containing nitrides, representing materials for devices operating in the ultraviolet (UV) range of the electromagnetic spectrum.

It is another object of the present invention to provide a method to achieve a tunnel junction device, such as an LED, laser, or electronic device, in III-nitride by metal organic chemical vapor deposition (MOCVD). Here, material polarization is used to create regions of negative charge.

A tunnel junction is formed between the graded region and an n type region which may or may not be graded itself. Current flow across the junction occurs from the conduction band of the n region to the valence band of the graded region. The graded region may be connected to a separate region from which holes could be extracted. These regions could be regions doped with acceptors, or also metals, or a combination thereof, or a component of another tunnel junction. These separate regions may or may not be active regions.

The devices that this invention enables are tunnel junction LEDs, lasers, and electronic devices. Potential applications of one or more embodiments include applications in power electronics. Examples of devices include transistors or other devices useful in power electronics.

In addition, since there is no need for a separate MBE growth, this invention makes tunnel junction LEDs and lasers from deep UV through the visible into the infrared (IR) feasible with only MOCVD.

REFERENCES

The following references are incorporated by reference herein:

[1] H. Nie et al., "1.5-kV and 2.2-mΩ·cm$^2$ vertical GaN transistors on bulk-GaN substrates," *IEEE Electron Device Lett.*, vol. 35, no. 9, pp. 939-941, September 2014.

[2] S. Chowdhury et al., "Enhancement and depletion mode AlGaN/GaN CAVET with Mg-ion-implanted GaN as current blocking layer," *IEEE Electron Device Lett.*, vol. 29, no. 6, pp. 543-545, June 2008.

[3] S. Chowdhury et al., "CAVET on bulk GaN substrates achieved with MBE-regrown AlGaN/GaN layers to suppress dispersion," *IEEE Electron Device Lett.*, vol. 33, no. 1, pp. 41-43, January 2012.

[4] M. Kanechika et al., "A vertical insulated gate AlGaN/GaN heterojunction field-effect transistor," *Jpn. J. Appl. Phys.*, vol. 46, no. 21, pp. L503-L505, May 2007.

[5] M. Kodama et al., "GaN-based trench gate metal oxide semiconductor field-effect transistor fabricated with novel wet etching," *Appl. Phys. Exp.*, vol. 1, no. 2, pp. 021104-1-021104-3, February 2008.

[6] H. Otake et al., "GaN-based trench gate metal oxide semiconductor field effect transistors with over 100 cm$^2$/(V-s) channel mobility," *Jpn. J. Appl. Phys.*, vol. 46, no. 25, pp. L599-L601, June 2007.

[7] H. Otake et al., "Vertical GaN-based trench gate metal oxide semiconductor field-effect transistors on GaN bulk substrates,"*Appl. Phys. Exp.*, vol. 1, no. 1, pp. 011105-1-011105-3, January 2008.

[8] T. Oka et al., "Vertical GaN-based trench metal oxide semiconductor field-effect transistors on a freestanding GaN substrate with blocking voltage of 1.6 kV," *Appl. Phys. Exp.*, vol. 7, no. 2, pp. 021002-1-021002-3, January 2014.

[9] T. Oka et al., "1.8 ma cm' vertical GaN-based trench metal-oxide-semiconductor field-effect transistors on a free-standing GaN substrate for 1.2-kV-class operation, "*Appl. Phys. Exp.*, vol. 8, no. 5, pp. 054101-1-054101-3, May. 2015.

[10] J. Simon, V. Protasenko, C. Lian, H. Xing, and D. Jena, Science 327, 60 (2010)

[11] L. Zhang, K. Ding, J. C. Yan, J. X. Wang, Y. P. Zeng, T. B. Wei, Y. Y. Li, B. J. Sun, R. F. Duan, and J. M. Li, Appl. Phys. Lett. 97, 062193 (2010)

[12] T. Yasuda, K. Yagi, T. Suzuki, T. Nakashima, M. Watanabe, T. Takeuchi, M. Iwaya, S. Kamiyama, and I. Akasaki, Jpn. J. Appl. Phys. 52, 08JJ05 (2013)

[13] M. Qi, K. Nomoto, M. Zhu, Z. Hu, Y. Zhao, B. Song, G. Li, P. Fay, H. Xing, and D. Jena, Device Research Conference 73rd Annual, 2015, p. 31

[14] M. Laurent, A. Raman, D. Denninghoff, S. Keller, and U. K. Mishra, 53rd Annual Electronic Materials Conference, 2011, p. 54

[15] H. K. Cho, J. Y. Lee, G. M. Yang, and C. S. Kim, Appl. Phys. Left. 79, 215 (2001)

[16] M. Shiojiri, C. C. Cho, J. T. Hsu, J. R. Yang, and H. Saijo, J. Appl. Phys. 99, 073505 (2006)

[17] S. Keller, N. A. Fichtenbaum, M. Furukawa, J. S. Speck, S. P. DenBarrs, and U. K. Mishra, Appl. Phys. Lett. 90, 191908 (2007)

[18] J. Simon, A. K. Wang, H. Xing, S. Rajan, and D. Jena, Appl. Phys. Lett. 88, 042109 (2006)

[19] K. Kumakura, T. Makimoto, and N. Kobayashi, J. Appl. Phys. 93, 3370 (2003)

[20] H. K. Cho, J. Y. Lee, G. M. Yang, and C. S. Kim, Appl. Phys. Left. 79, 215 (2001)

[21] M. Shiojiri, C. C. Cho, J. T. Hsu, J. R. Yang, and H. Saijo, J. Appl. Phys. 99, 073505 (2006)

[22] Y. Enatsu, C. Gupta, M. Laurent, S. Keller, S. Nakamura, U. K. Mishra, Appl. Phys. Express 9, 075502 (2016).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An optoelectronic or electronic device structure, comprising:
    an active region on or above a polar substrate or base layer, wherein the active region comprises a polar p region comprising graded polar materials having a polar orientation or an abrupt interface or multiple interfaces between layers with a polarization discontinuity; and
    a hole supply region on the active region, and wherein:
    holes in the hole supply region are driven by a field into the active region, and the field arises at least in part due to a piezoelectric and/or spontaneous polarization field generated by a composition and grading of the active region, wherein:
    a thickness and doping of the hole supply region, and the composition and the grading of an active region are selected such that the field creates a negative charge of at least $8 \times 10^{19}$ cm$_{-3}$ in the active region and at least one of:
    a diode comprising the hole supply region on the active region has a turn on voltage of no more than 5.0 Volts, or
    the holes neutralizing at least 50% of the negative charge created by the field.

2. A method of fabricating an optoelectronic or electronic device structure, comprising:
    depositing a polar p region on or above a polar substrate or base layer, the polar p region comprising graded polar materials having a polar orientation or an abrupt interface or multiple interfaces between layers with a polarization discontinuity; and
    depositing a hole supply region on the polar p region, and wherein:
    holes in the hole supply region are driven by a field into the polar p region, and
    the field arises at least in part due to a piezoelectric polarization field, a spontaneous polarization field, or the piezoelectric and the spontaneous polarization field generated by the polar p region, wherein:

a thickness and doping of the hole supply region, and composition and grading of an active region are selected such that the field creates a negative charge of at least $8 \times 10^{19}$ cm$^{-3}$ in the active region and at least one of:

a diode comprising the hole supply region on the active region having a turn on voltage of no more ethan 5.0 Volts, or the holes neutralizing at least 50% of the negative charge created by the field.

3. The method of claim 2, wherein the substrate or the base layer is a c-plane III-nitride substrate.

4. The method of claim 2, wherein the substrate or the base layer is GaN on sapphire.

5. The method of claim 2, wherein the hole supply region comprises an activated p-type layer.

6. The method of claim 2, further comprising:
depositing one or more additional layers on the polar p region;
at least partially etching one or more of the additional layers to form an etched region; and
depositing the hole supply region, comprising a doped p-type region, in the etched region.

7. The method of claim 6, wherein the additional layers on the polar p region are III-nitride layers and the doped p-type region is p-type GaN.

8. The method of claim 2, further comprising:
depositing one or more additional layers on the hole supply region, the hole supply region comprising a p-type region;
at least partially etching the p-type region and one or more of the additional layers to form an etched region; and
activating the p-type region in the etched region.

9. The method of claim 8, further comprising:
growing a further p-type region in the etched region, wherein the activating comprises activating the p-type region grown in the etched region.

10. The method of claim 2, wherein the hole supply region comprises an activated p-type layer on a surface of the device structure.

11. The method of claim 2, wherein:
the hole supply region comprises a p-type region that is etched or selectively regrown so that it does not completely cover the graded polar materials.

12. The method of claim 2, wherein the hole supply region comprises or consists essentially of metal.

13. The method of claim 12, wherein:
the graded polar materials comprise a steep grade adjacent the metal,
the steep grade enables tunneling of the holes from the metal into the graded polar materials, and
the device structure does not include a p-type doped region.

14. The method of claim 2, further comprising depositing an active region comprising the polar p region, wherein the holes are driven into the active region so as to form a hole gas in the active region.

15. The method of the claim 2, further comprising depositing the active region comprising the polar p region, wherein the device structure is fabricated without providing acceptor dopants in the active region.

16. An optoelectronic or electronic device structure, comprising:
a polar p region on or above a polar substrate or base layer, the polar p region comprising graded polar materials having a polar orientation or an abrupt interface or multiple interfaces between layers with a polarization discontinuity; and
a hole supply region on the polar p region, and wherein:
holes in the hole supply region are driven by a field into the polar p region, and
the field arises at least in part due to a piezoelectric and/or spontaneous polarization field generated by the polar p region, and wherein:
a thickness and doping of the hole supply region, and composition and grading of an active region are selected such that the field creates a negative charge of at least $8 \times 10^{19}$ cm$^{-3}$ in the active region and at least one of:
a diode comprising the hole supply region on the active region on the active region ahs a turn on voltage of no more than 5.0 Volts, or
the holes neutralizing at least 50% of the negative charge created by the field.

17. The device structure of claim 16, wherein the hole supply region comprises or consists essentially of doped p-type GaN and/or a metal.

18. The device structure of claim 16, further comprising the active region including the polar p region, wherein the holes driven into the active region form a hole gas in the active region and the device structure is:
a transistor, or
a light emitting device, the holes recombining with electrons in the active region to emit light emitted by the light emitting device.

19. The device structure of claim 16, further comprising the active region including a graded layer, wherein the active region is undoped.

20. The device structure of claim 16, wherein the device structure comprises a flip-chip light emitting diode and the hole supply region is a p-GaN layer buried beneath a surface of the light emitting diode.

21. The device structure of claim 16, wherein a graded layer is the active region in the device structure or part of a tunnel junction forming an electrical contact to the device structure.

* * * * *